(12) United States Patent
Takaya et al.

(10) Patent No.: US 7,081,803 B2
(45) Date of Patent: Jul. 25, 2006

(54) INDUCTANCE ELEMENT, LAMINATED ELECTRONIC COMPONENT, LAMINATED ELECTRONIC COMPONENT MODULE AND METHOD FOR PRODUCING THESE ELEMENT, COMPONENT AND MODULE

(75) Inventors: Minoru Takaya, Tokyo (JP); Toshikazu Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 65 days.

(21) Appl. No.: 10/767,373

(22) Filed: Jan. 30, 2004

(65) Prior Publication Data

US 2004/0183645 A1    Sep. 23, 2004

(30) Foreign Application Priority Data

Jan. 31, 2003   (JP)   ............................. 2003-025142

(51) Int. Cl.
*H01F 5/00* (2006.01)
(52) U.S. Cl. ..................................... 336/200
(58) Field of Classification Search .................. 336/65, 336/83, 200, 232; 257/531
See application file for complete search history.

(56) References Cited

U.S. PATENT DOCUMENTS

| | | | |
|---|---|---|---|
| 3,881,244 A | 5/1975 | Kendall | |
| 6,031,445 A | 2/2000 | Marty et al. | |
| 6,914,509 B1* | 7/2005 | Yu et al. | 336/200 |
| 2003/0112114 A1* | 6/2003 | Long et al. | 336/200 |
| 2004/0263308 A1* | 12/2004 | Yu et al. | 336/200 |
| 2005/0122199 A1* | 6/2005 | Ahn et al. | 336/200 |

FOREIGN PATENT DOCUMENTS

| | | |
|---|---|---|
| JP | 6-50312 | 7/1994 |
| JP | 11-103229 | 4/1999 |
| JP | 11-204352 | 7/1999 |
| JP | 2607433 | 6/2001 |
| JP | 2002-92566 | 3/2002 |
| JP | 2003-197426 | 7/2003 |
| JP | 2003-197427 | 7/2003 |

* cited by examiner

*Primary Examiner*—Tuyen T Nguyen
(74) *Attorney, Agent, or Firm*—Oblon, Spivak, McClelland, Maier & Neustadt, P.C.

(57) ABSTRACT

A laminated electronic component including at least one inductance element and produced from a laminate having electrical insulators and electrical conductors laminated alternately. The inductance element is formed as a helical coil having a plurality of turns each constituted by four sides. The inductance element has pairs of parallel conductor pieces and pairs of bridging conductor pieces. Each pair of parallel conductor pieces form two of the four sides of one turn of the coil. Each pair of bridging conductor pieces form the other two sides of one turn of the coil. Grooves are formed in the laminate to thereby form the parallel conductor pieces. The grooves are filled with an electrically insulating material. The bridging conductor pieces are formed on the electrically insulating material.

6 Claims, 17 Drawing Sheets

INDUCTANCE ELEMENT, LAMINATED ELECTRONIC COMPONENT, LAMINATED ELECTRONIC COMPONENT MODULE AND METHOD FOR PRODUCING THESE ELEMENT, COMPONENT AND MODULE

BACKGROUND OF THE INVENTION

The present invention relates to an inductance element, a laminated electronic component with at least built in inductance and capacitance elements, a laminated electronic component module with at least one built-in inductance element among inductance and capacitance elements, and a method for producing these element, component and module.

For example, Patent Document 1 has disclosed a ceramic electronic component having a laminated inductor and a laminated capacitor integrally piled by a printing method as a laminated electronic component with built-in inductance and capacitance elements.

For example, Patent Document 2 has disclosed a ceramic electronic component having a laminated inductor and a laminated capacitor integrally piled by a sheet laminating method.

For example, Patent Document 3 has disclosed an electronic component having a multi-layer spiral coil formed on a semiconductor chip.

For example, Patent Document 4 has disclosed a transformer having two wire-wound coil elements arranged and sealed with a resin.

[Patent Document 1]-Japanese Utility Model Registration No. 2,607,433 (page 2 and FIG. 1)

[Patent Document 2] JP-A-11-103229 (pages 4 and 5 and FIG. 2)

[Patent Document 3] JP-A-2002-92566 (page 6 and FIG. 1)

[Patent Document 4] JP-A-11-204352 (page 3 and FIG. 2)

In the ceramic laminated electronic components disclosed in Patent Documents 1 and 2, both variation due to printing and variation due to lamination occur because inner conductors are laminated as a laminate of plurality of layers by a printing method or a sheet laminating method. Moreover, variation in inductance value is caused by shrinkage at the time of sintering and variation due to the shrinkage because elements are sintered. Accordingly, it is difficult to obtain laminated electronic components of narrow tolerance.

When, for example, the structure of the conventional ceramic laminated electric component is directly used so that ceramic laminated electronic components are included or mounted in a laminated electronic component module provided as a laminate of boards each made of a resin material or a composite material as a mixture of a resin and functional material powder, the thickness of each ceramic laminated electronic component is limited-within the thickness of the module, that is, the number of turns in a coil and the number of electrode layers in a capacitor are limited. This causes a problem that it is difficult to obtain sufficiently high inductance and capacitance.

Each of inductors included in the module is of the type in which a coil is wound up in the laminating direction. Because this type inductor is strongly affected by ground layers and capacitor layers provided in the laminate, it is relatively difficult to obtain a high inductance value and a high Q value.

In the conventional laminated electronic component using a spiral coil as described in Patent Document 3, it is structurally difficult to obtain a high Q value. Moreover, the shape of the coil becomes too large. Accordingly, when a plurality of elements are included in the laminated electronic component, adjacent elements become close to each other so that required characteristic cannot be obtained because of coupling of the elements. In addition, there is a problem that the shape of the coil becomes large if it is necessary to obtain the same Q value and inductance value as those of a helical coil.

In the wire type transformer as described in Patent Document 4, difficulties arise in both reduction in size and productivity because bobbins must be one by one wound with wires Accordingly, it is difficult to obtain laminated electronic components inexpensively.

SUMMARY OF THE INVENTION

The invention is developed in consideration of the problems in the conventional laminated electronic components, that is, an object of the invention is to provide an inductance element, a laminated electronic component and a laminated electronic component module easy to mass-produce, small in displacement in conductor pattern and low in tolerance as a characteristic value, and a method for producing these element, component and module.

Another object of the invention is to provide a laminated electronic component and a method for producing the laminated electronic component, which can be simplified in production process compared with the background art so that reduction in cost can be achieved.

A further object of the invention is to provide a laminated electronic component module and a method for producing the laminated electronic component module, in which laminated electronic components embedded in the module are little affected by upper and lower ground layers, wiring layers-or capacitor electrodes so that high inductance and high Q characteristic can be obtained.

(1) The invention provides an inductance element produced from a laminate having electrical insulators and electrical conductors laminated alternately, the inductance element including a helical coil having a plurality of turns each constituted by four sides, wherein: two of the four sides of each turn are formed as two parallel conductor pieces when the laminate is processed so that a plurality of slots (through-grooves) are formed in the laminate or a plurality of grooves are formed in the laminate and bottoms of the grooves are removed; the grooves formed in the laminating direction by the processing are filled with an electrically insulating material; the other two sides of each turn of the coil are formed as two bridging conductor pieces formed on the electrically insulating material packed in the grooves so that end portions of the two parallel conductor pieces formed by the processing are connected to each other by the two bridging conductor pieces to thereby form the helical coil; and top, bottom and side surfaces of the element are covered with electrically insulating layers respectively while external connecting terminal electrodes are provided on an outer surface of the element.

(2) Preferably, the inductance element according to the invention is formed as an array of inductance elements.

(3) Preferably, the inductance element according to the invention has an antenna function.

(4) Preferably, the inductance element according to the invention forms a transformer.

(5) Preferably, in the inductance element according to the invention, the electrical insulators, the electrically insulating material and the electrically insulating layers are made of either of a resin material and a composite material as a mixture of a resin and functional material powder.

(6) Preferably, in the inductance element according to the invention, the parallel conductor pieces are made of either of a metal plate and a sheet of metal foil whereas the bridging conductor pieces are formed by photolithography.

(7) The invention also provides a laminated electronic component produced from a laminate having electrical insulators and electrical conductors laminated alternately, the laminated electronic component including at least one inductance element, and at least one capacitance element as independent elements or as a composite inductance-capacitance element, wherein: elements adjacent in a direction perpendicular to a laminating direction of the laminate are separated from each other by an electrically insulating material packed in a groove formed between the adjacent elements; the inductance element includes a helical coil having a plurality of turns each constituted by four sides; two of the four sides of each turn of the coil are formed as two parallel conductor pieces when the laminate is processed so that a plurality of slots are formed in the laminate or a plurality of grooves are formed in the laminate and bottoms of the grooves are removed; the grooves formed in the laminating direction by the processing are filled with an electrically insulating material; the other two sides of each turn of the coil are formed as two bridging conductor pieces formed on the electrically insulating material packed in the grooves so that end portions of the two parallel conductor pieces formed by the processing are connected to each other by the two bridging conductor pieces to thereby form the helical coil; the capacitance element is formed so as to be separated from other elements by the grooves formed in the laminate and the electrically insulating material packed in the grooves, the capacitance element including electrodes forming the same layers as those of the parallel conductor pieces of the coil, and conductors for connecting the electrodes to one another; and top and bottom surfaces of the electronic component are covered with electrically insulating layers respectively while external connecting terminal electrodes are provided on an outer surface of the electronic component.

(8) Preferably, in the laminated electronic component according to the invention, the electrical insulators, the electrically insulating material and the electrically insulating layers are made of either of a resin material and a composite material as a mixture of a resin and functional material powder.

(9) Preferably, in the laminated electronic component according to the invention, the parallel conductor pieces are made of either of a metal plate and a sheet of metal foil whereas the bridging conductor pieces and the connecting conductors are formed by photolithography.

(10) The invention further provides a laminated electronic component module with built-in elements formed in such a manner that a board having electrical conductor layers formed therein is laminated on a layer made of either of a resin material and a composite material as a mixture of a resin and functional material powder, wherein: the laminated electronic component module includes, as one layer, at least one board containing at least one inductance element; the inductance element-containing board is produced from a laminate having electrical insulators and electrical conductors laminated alternately; the inductance element is made of a helical coil having a plurality of turns each constituted by four sides; two of the four sides of one turn of the coil are formed as parallel conductor pieces when the laminate is processed so that a plurality of slots are formed in the laminate or a plurality of grooves are formed in the laminate and bottoms of the grooves are removed; the grooves formed in the laminating direction by the processing are filled with an electrically insulating material; and the other two sides of one turn of the coil are formed as bridging conductor pieces which are formed on the electrically insulating material packed in each groove so that end portions of the parallel conductor pieces formed by the processing are connected to one another by the bridging conductor pieces to form the helical coil.

(11) The invention further provides a laminated electronic component module with built-in elements formed in such a manner that a board having electrical conductor layers formed therein is laminated on a layer made of either of a resin material and a composite material as a mixture of a resin and functional material powder, wherein: the laminated electronic component module includes, as one layer, at least one board containing at least one inductance element, and at least one capacitance element; the inductance and capacitance element-containing board is produced from a laminate having electrical insulators and electrical conductors laminated alternately so that elements adjacent in a direction perpendicular to the laminating direction of the laminate are isolated from each other by an electrically insulating material packed in each groove formed between the elements; the inductance element is made of a helical coil having a plurality of turns each constituted by four sides; two of the four sides of one turn of the coil are formed as parallel conductor pieces when the laminate is processed so that a plurality of slots are formed in the laminate or a plurality of grooves are formed in the laminate and bottoms of the grooves are removed; the grooves formed in the laminating direction by the processing are filled with an electrically insulating material; the other two sides of one turn of the coil are formed as bridging conductor pieces which are formed on the electrically insulating material packed in each groove so that end portions of the parallel conductor pieces formed by the processing are connected to one another by the bridging conductor pieces to form the helical coil; and the capacitance element has electrodes and a pair of electrical conductors for connecting electrodes to one another alternately, the electrodes formed as the same layers as the parallel conductor pieces of the coil when grooves are formed in the laminate.

(12) Preferably, in the laminated electronic component module according to the invention, the core direction of the coil of the inductance element is formed as a direction perpendicular to the laminating direction of the laminated electronic component module.

(13) The invention further provides a method of producing inductance elements from a laminate having electrical conductor layers and electrical insulator layers laminated alternately in order to obtain inductance elements defined in any one of the paragraphs (1) through (6), the method including the steps of: preparing a quadrangular plate-like raw material having a number of electrical conductor layers corresponding to the number of turns in a plurality of inductance elements in a laminating direction of the laminate and having a thickness corresponding to the thickness of one inductance element; processing the raw material so that a plurality of first grooves each having a predetermined width for forming opposite sides of parallel conductor pieces of a helical coil are formed in a front surface of the raw material so as to be parallel with one another in the laminating direction while a plurality of second grooves for forming side portions of the helical coil are formed in the front surface of the raw material so as to be parallel with the first grooves; filling the first and second grooves with an electrically insulating material; grinding the front surface of the raw material filled with the electrically insulating material to thereby shape the front surface of the raw material; grinding a rear surface of the shaped raw material to remove electrical conductors from the rear surface of the raw material to thereby form the parallel conductor pieces; forming bridging conductor pieces on the front and rear surfaces of the raw material by photolithography to connect end portions of the parallel conductor pieces to one another by the bridging conductor pieces to form the helical coil while forming starting electrodes for terminal electrodes on either of the front and rear surfaces of the raw material by photolithography; covering the front and rear surfaces of the raw material having the bridging conductor pieces with an electrically insulating material and removing part of the electrically insulating material to reveal the starting electrodes to thereby form the terminal electrodes; and cutting the raw material lengthwise and crosswise to thereby obtain the plurality of inductance elements.

(14) The invention further provides a method of producing inductance elements from a laminate having electrical conductor layers and electrical insulator layers laminated alternately in order to obtain inductance elements defined in any one of the paragraphs (1) through (6), the method including the steps of: preparing a quadrangular plate-like raw material having a number of electrical conductor layers corresponding to the number of turns in a plurality of inductance elements in a laminating direction of the laminate and having a thickness corresponding to the thickness of one inductance element; processing the raw material so that a plurality of first grooves each having a predetermined width for forming opposite sides of parallel conductor pieces of a helical coil are formed in a front surface of the raw material so as to be parallel with one another in the laminating direction; filling the first grooves with an electrically insulating material; grinding the front surface of the raw material filled with the electrically insulating material to thereby shape the front surface of the raw material; processing the raw material so that a plurality of second grooves for forming side portions of the helical coil are formed in the front surface of the raw material so as to be parallel with the first grooves; filling the second grooves with an electrically insulating material; grinding the front surface of the raw material filled with the electrically insulating material to thereby shape the front surface of the raw material; grinding a rear surface of the shaped raw material to remove electrical conductors from the rear surface of the raw material to thereby form the parallel conductor pieces; forming bridging conductor pieces on the front and rear surfaces of the raw material by photolithography to connect end portions of the parallel conductor pieces to one another by the bridging conductor pieces to form the helical coil while forming starting electrodes for terminal electrodes on either of the front and rear surfaces of the raw material by photolithography; covering the front and rear surfaces of the raw material having the bridging conductor pieces with an electrically insulating material and removing part of the electrically insulating material to reveal the starting electrodes to thereby form the terminal electrodes; and cutting the raw material lengthwise and crosswise to thereby obtain the plurality of inductance elements.

(15) The invention further provides a method of producing inductance elements from a laminate having electrical conductor layers and electrical insulator layers laminated alternately in order to obtain inductance elements defined in any one of the paragraphs (1) through (6), the method including the steps of: preparing a quadrangular plate-like raw material having a number of electrical conductor layers corresponding to the number of turns in a plurality of inductance elements in a laminating direction of the laminate and having a thickness corresponding to the thickness of one inductance element; processing the raw material so that a plurality of first slots each having a predetermined width for forming opposite sides of parallel conductor pieces of a helical coil are formed in a front surface of the raw material so as to be parallel with one another in the laminating direction while a plurality of second slots for forming side portions of the helical coil are formed in the front surface of the raw material so as to be parallel with the first slots; filling the first and second slots with an electrically insulating material; grinding front and rear surfaces of the raw material filled with the electrically insulating material to thereby shape the front and rear surface of the raw material; forming bridging conductor pieces on the front and rear surfaces of the raw material by photolithography to connect end portions of the parallel conductor pieces to one another by the bridging conductor pieces to form the helical coil while forming starting electrodes for terminal electrodes on either of the front and rear surfaces of the raw material by photolithography; covering the front and rear surfaces of the raw material having the bridging conductor pieces with an electrically insulating material and removing part of the electrically insulating material to reveal the starting electrodes to thereby form the terminal electrodes; and cutting the raw material lengthwise and crosswise to thereby obtain the plurality of inductance elements.

(16) The invention further provides a method of producing laminated electronic components with built-in inductance and capacitance elements from a laminate having electrical conductor layers and electrical insulator layers laminated alternately in order to obtain laminated electronic components defined in any one of the paragraphs (7) through (9), the method including the steps of: preparing a quadrangular plate-like raw material having a number of electrical conductor layers corresponding to the number of turns in a plurality of inductance elements in a laminating direction of the laminate, having a number of electrical conductor layers corresponding to the number of electrodes in a plurality of capacitance elements and having a thickness corresponding to the thickness of one inductance element/capacitance element; processing the raw material so that a plurality of first grooves each having a predetermined width for forming opposite sides of parallel conductor pieces of a helical coil are formed in a front surface of the raw material so as to be parallel with one another in the laminating direction while a plurality of second grooves for separating elements from one another are formed in the front surface of the raw material so as to be parallel with the first grooves; filling the first and second grooves with an electrically insulating material; grinding the front surface of the raw material filled with the electrically insulating material to thereby shape the front surface of the raw material; grinding a rear surface of the shaped raw material to remove electrical conductors from the rear surface of the raw material to thereby form the parallel conductor pieces for the inductance elements; forming bridging conductor pieces on the front and rear surfaces of the raw material by photolithography to connect end portions of the parallel conductor pieces to one another by the bridging conductor pieces to form the helical coil while forming starting electrodes for terminal electrodes and electrical conductors for connecting elements on either of the front and rear surfaces of the raw material by photolithography; covering the front and rear surfaces of the raw material with an electrically insulating material and removing part of the electrically insulating material to reveal the starting electrodes to thereby form the terminal electrodes; and cutting the raw material lengthwise and crosswise to thereby obtain the laminated electronic components with built-in inductance and capacitance elements.

(17) The invention further provides a method of producing laminated electronic components with built-in inductance and capacitance elements from a laminate having electrical conductor layers and electrical insulator layers laminated alternately in order to obtain laminated electronic components defined in any one of the paragraphs (7) through (9), the method including the steps of:

preparing a quadrangular plate-like raw material having a number of electrical conductor layers corresponding to the number of turns in a plurality of inductance elements in a laminating direction of the laminate, having a number of electrical conductor layers corresponding to the number of electrodes in a plurality of capacitance elements and having a thickness corresponding to the thickness of one inductance element/capacitance element; processing the raw material so that a plurality of first grooves each having a predetermined width for forming opposite sides of parallel conductor pieces of a helical coil are formed in a front surface of the raw material so as to be parallel with one another in the laminating direction; filling the first grooves with an electrically insulating material; grinding the front surface of the raw material filled with the electrically insulating material to thereby shape the front surface of the raw material; processing the raw material so that a plurality of second grooves for separating elements from one another are formed in the front surface of the raw material so as to be parallel with the first grooves; filling the second grooves with an electrically insulating material; grinding the front surface of the raw material filled with the electrically insulating material to thereby shape the front surface of the raw material; grinding a rear surface of the shaped raw material to remove electrical conductors from the rear surface of the raw material to thereby form the parallel conductor pieces for the inductance elements; forming bridging conductor pieces on the front and rear surfaces of the raw material by photolithography to connect end portions of the parallel conductor pieces to one another by the bridging conductor pieces to form the helical coil while forming starting electrodes for terminal electrodes and electrical conductors for connecting elements on either of the front and rear surfaces of the raw material by photolithography; covering the front and rear surfaces of the raw material with an electrically insulating material and removing part of the electrically insulating material to reveal the starting electrodes to thereby form the terminal electrodes; and cutting the raw material lengthwise and crosswise to thereby obtain the laminated electronic components with built-in inductance and capacitance elements.

(18) The invention further provides a method of producing laminated electronic components with built-in inductance and capacitance elements from a laminate having electrical conductor layers and electrical insulator layers laminated alternately in order to obtain laminated electronic components defined in any one of the paragraphs (7) through (9), the method including the steps of: preparing a quadrangular plate-like raw material having a number of electrical conductor layers corresponding to the number of turns in a plurality of inductance elements in a laminating direction of the laminate, having a number of electrical conductor layers corresponding to the number of electrodes in a plurality of capacitance elements and having a thickness corresponding to the thickness of one inductance element/capacitance element; processing the raw material so that a plurality of first slots each having a predetermined width for forming opposite sides of parallel conductor pieces of a helical coil are formed in a front surface of the raw material so as to be parallel with one another in the laminating direction while a plurality of second slots for separating elements to one another are formed in the front surface of the raw material so as to be parallel with the first slots; filling the first and second slots with an electrically insulating material; grinding front and rear surfaces of the raw material filled with the electrically insulating material to thereby shape the front and rear surface of the raw material; forming bridging conductor pieces on the front and rear surfaces of the raw material by photolithography to connect end portions of the parallel conductor pieces to one another by the bridging conductor pieces to form the helical coil while forming starting electrodes for terminal electrodes and electrical conductors for connecting elements on either of the front and rear surfaces of the raw material by photolithography; covering the front and rear surfaces of the raw material with an electrically insulating material and removing part of the electrically insulating material to reveal the starting electrodes to thereby form the terminal electrodes; and cutting the raw material lengthwise and crosswise to thereby obtain the laminated electronic components with built-in inductance and capacitance elements.

(19) The invention further provides a method of producing a laminated electronic component module having electrical conductor layers formed on a layer made of either of a resin material and a composite material as a mixture of a resin and functional material powder in order to obtain a laminated electronic component module defined in any one of the paragraphs (10) through (12), the method including the steps of: forming, as a core board, a laminated electronic component including at least one inductance element among inductance and capacitance elements, and external connecting conductors formed in either of front and rear surfaces, the inductance element formed as a helical coil having parallel conductor pieces, and bridging conductor pieces formed by photolithography to connect end portions of the parallel conductor pieces to one another by the bridging conductor pieces; and forming the laminated electronic component module by repeating a process of laminating sheets of prepreg and conductor foil on at least one of the front and rear surface of the core board, curing the prepreg, forming conductor patterns by etching and connecting layers to one another.

BRIEF DESCRIPTION OF THE DRAWINGS

FIG. 7C is a sectional view showing a state in which holes are formed in the electrically insulating layer on portions of electrode pads by laser beam machining or the like.

DETAILED DESCRIPTION OF THE PREFERRED EMBODIMENTS

Figure 1A:
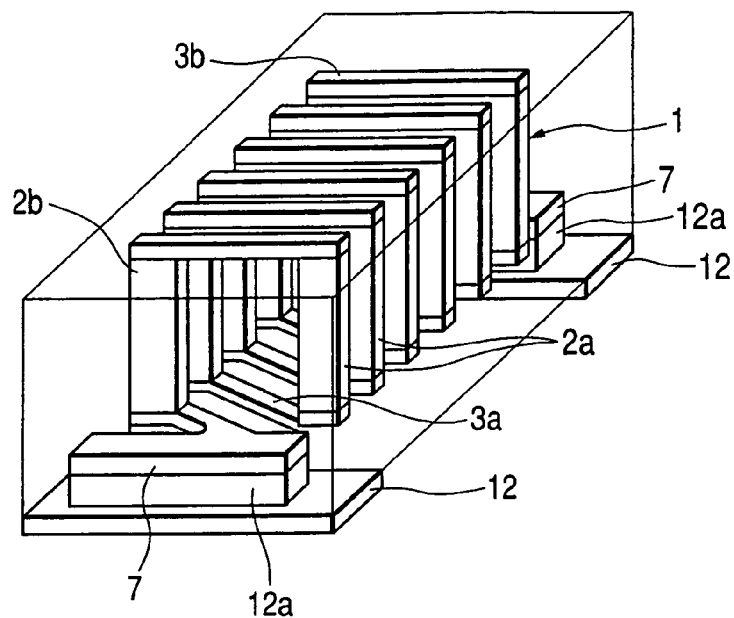
FIG. 1A is a see-through perspective view showing an inductance element according to an embodiment of the invention.

FIG. 1A is a see-through perspective view showing an embodiment of an inductance element according to the invention.

Figure 1B:
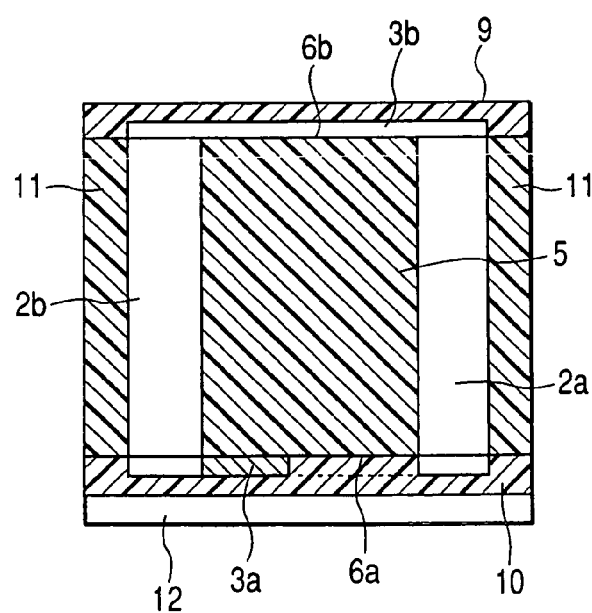
FIG. 1B is a sectional view showing the configuration of a coil in the inductance element.
Figure 1C:
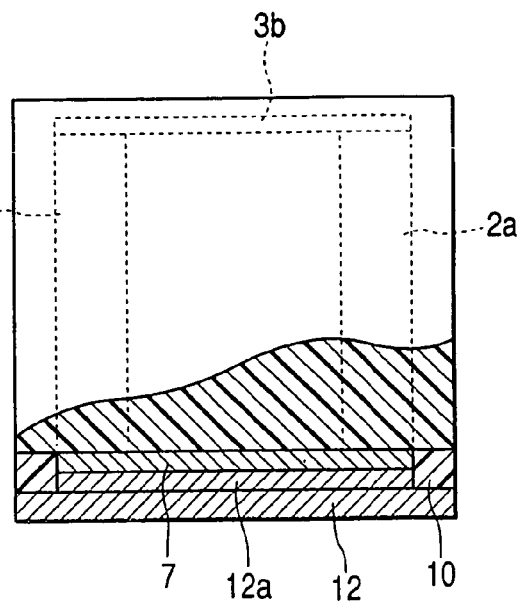
FIG. 1C is a sectional view showing the structure of electrodes in the inductance element.
Figure 2A:
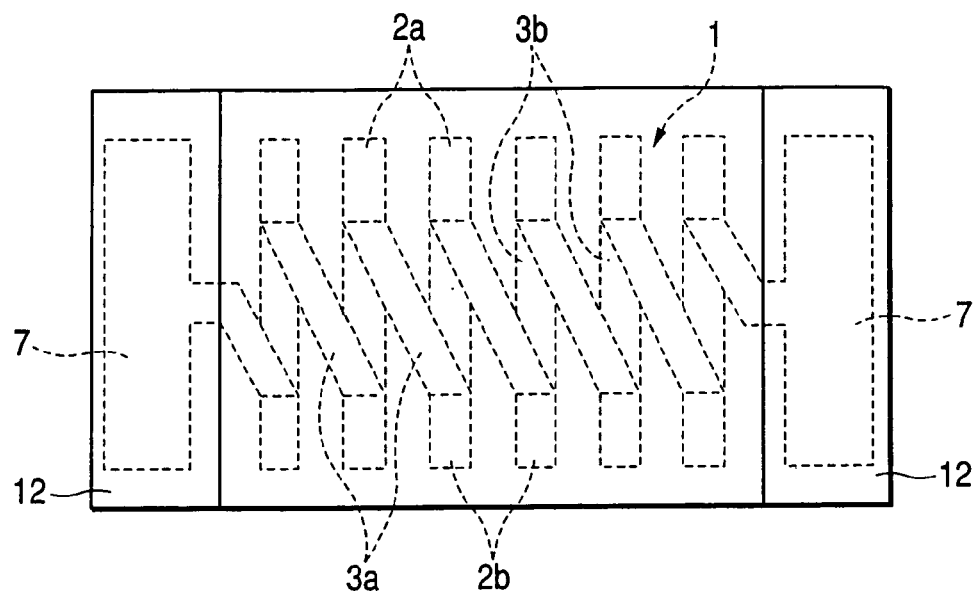
FIG. 2A is a bottom view of the inductance element according to this embodiment.
Figure 2B:
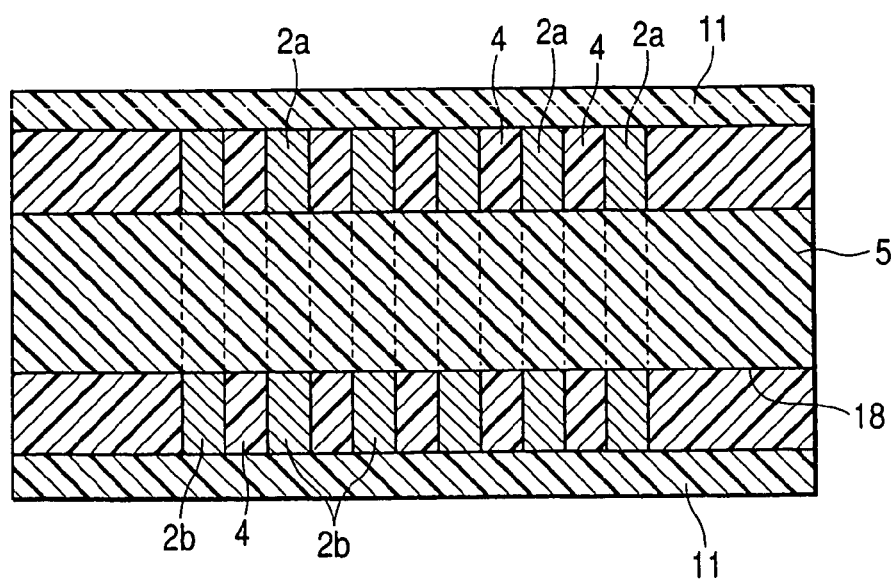
FIG. 2B is a sectional view of the inductance element.

FIG. 1B is a sectional view showing the configuration of a coil in the inductance element. FIG. 1C is a sectional view showing the structure of an electrode in the inductance element. FIG. 2A is a bottom view of the inductance element. FIG. 2B is a sectional view of the inductance element.

In FIGS. 1A to 1C and FIGS. 2A and 2B, the reference numeral 1 designates a rectangular helical coil. The coil 1 includes pairs of parallel conductor pieces 2a and 2b, and pairs of bridging conductor pieces 3a and 3b. Each pair of parallel conductor pieces 2a and 2b form two of four sides of one turn of the coil 1. Each pair of bridging conductor pieces 3a and 3b form the other two sides of one turn of the coil 1. Adjacent parallel conductor pieces 2a and 2b are connected to one another by the bridging conductor pieces 3a and 3b respectively to thereby form the rectangular helical coil 1. As shown in FIG. 2B, electrically insulating layers 4 are interposed between adjacent parallel conductor pieces 2a and 2a and between adjacent parallel conductor pieces 2b and 2b, respectively.

As shown in FIG. 2B, opposite sides of the parallel conductor pieces 2a and 2b are formed as side surfaces of first grooves 18 by a cutting process which will be described later. An electrically insulating material 5 is embedded in each of the grooves 18. Opposite surfaces 6a and 6b (see FIG. 1B) of the electrically insulating material 5 and the parallel conductor pieces 2a and 2b are ground so as to be shaped. The bridging conductor pieces 3a and 3b and electrode pads 7 at opposite ends of the coil 1 are formed on the shaped surfaces. The reference numerals 9 and 10 designate electrically insulating layers which are provided on top and bottom surfaces of the inductance element so that the top and bottom surfaces of the inductance element are covered with the electrically insulating layers respectively. The reference numeral 11 designates an electrically insulating layer provided on each of opposite side surfaces of the inductance element. The reference numeral 12 designates a terminal electrode provided at each of opposite ends of the bottom surface of the inductance element. The reference numeral 12a designates an electrical conductor which forms an undercoat layer for connecting each electrode pad 7 to a corresponding terminal electrode 12.

The electrically insulating layers 4, the electrically insulating material 5 and the electrically insulating layers 9 to 11 for covering the outer surface of the inductance element are made of a resin material or a composite material prepared as a mixture of a resin and functional material powder. The parallel conductor pieces 2a and 2b are made of a metal plate or a sheet of metal foil. There may be used a raw material using ceramic plates as the electrically insulating layers 4 or a raw material prepared in such a manner that conductor paste for forming the parallel conductor pieces 2a and 2b is applied to ceramic green sheets for forming the electrically insulating layers 4 and baked. The bridging conductor pieces 3a and 3b are made of electrical conductors patterned by photolithography. The bridging conductor pieces 3a and 3b may be formed by plating or may be formed as films by vapor deposition or sputtering.

Figure 3A:
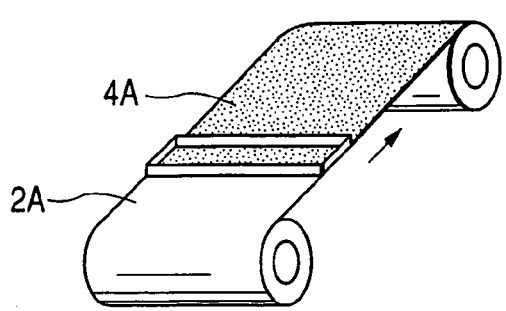
FIG. 3A is a perspective view showing a sheet as a raw material used in this embodiment.

FIGS. 3A to 3E, FIGS. 4A to 4C, FIGS. 5A to 5C, FIGS. 6A to 6C, FIGS. 7A to 7D and FIG. 8 are views showing an embodiment of a method for producing the laminated electronic component. First, a resin material or a composite material as a mixture of a resin and functional material powder is dispersed into a solvent and a binder to prepare a paste. As shown in FIG. 3A which is a perspective view, the paste is applied onto a sheet of metal foil 2A by a doctor blade method or the like in order to obtain parallel conductor pieces 2a and 2b which are electrical conductor layers. The paste is dried to form an electrically insulating layer 4A.

In this case, copper foil is preferably used as the metal foil 2A. A metal such as nickel, silver, gold or aluminum or an alloy of the metal may be used as the material of the metal foil 2A. The thickness of the metal foil 2A is preferably in a range of from 5 µm to 75 µm. The thickness of the electrically insulating layer 4A is preferably in a range of from 5 µm to 100 µm.

A heat-curable resin or a thermoplastic resin may be used as the resin material used in the electrically insulating layer 4A. Examples of the heat-curable resin include an epoxy resin, a phenol resin, an unsaturated polyester resin, a vinyl ester resin, a polyimide resin, a polyphenylene ether (oxide) resin, a bismaleimide triazine (cyanate ester) resin, a fumarate resin, a polybutadiene resin, and a polyvinyl benzyl ether compound resin.

Examples of the thermoplastic resin include a polybutadiene resin, an aromatic polyester resin, a polyphenylene sulfide resin, a polyphenylene ether (oxide) resin, a polyethylene terephthalate resin, a polybutylene terephthalate resin, a polyethylene sulfide resin, a polyether-ether-ketone resin, a polytetrafluoroethylene resin, and a graft resin. Especially, a phenol resin, an epoxy resin, a low dielectric constant epoxy resin, a polybutadiene resin, a bismaleimide triazine (cyanate ester) resin or a vinyl benzyl resin may be preferably used as a base resin. One kind of resin selected from these resins may be used singly or two or more kinds of resins selected from these resins may be used in combination. When two or more kinds of resins are used in combination, the mixture ratio of the resins can be selected optionally.

When a composite material is used, functional material powder contained in the composite material is selected as follows. Examples of the functional material powder preferably used in order to obtain a relatively high dielectric constant include titanium-barium-neodymium ceramics, titanium-barium-tin ceramics, lead-calcium ceramics, titanium dioxide ceramics, barium titanate ceramics, lead titanate ceramics, strontium titanate ceramics, calcium titanate ceramics, bismuth titanate ceramics, magnesium titanate ceramics, $CaWO_4$ ceramics, $Ba(Mg,Nb)O_3$ ceramics, $Ba(Mg,Ta)O_3$ ceramics, $Ba(Co,Mg,Nb)O_3$ ceramics, and $Ba(Co,Mg,Ta)O_3$ ceramics.

The concept "titanium dioxide ceramics" includes ceramics containing a small amount of additives other than titanium dioxide if the crystallographic structure of titanium dioxide can be retained. This rule applies to the other ceramics. Particularly ceramics having a rutile structure may be preferably used as the titanium dioxide ceramics.

Examples of dielectric powder preferably used to be mixed with the resin material in order to obtain a high Q value without considerable increase in dielectric constant include silica, alumina, zirconia, potassium titanate whisker, calcium titanate whisker, barium titanate whisker, zinc oxide whisker, chopped glass, glass beads, carbon fiber, and magnesium oxide (talc) One kind of resin selected from these resins may be used singly or two or more kinds of resins selected from these resins may be used in combination. When two or more kinds of resins are used in combination, the mixture ratio of the resins can be selected optionally.

When a magnetic substance is used as the functional material powder mixed with the resin material, ferrite or ferromagnetic metal can be used as the magnetic substance. Examples of the ferrite include Mn—Mg—Zn ferrite, Ni—Zn ferrite, and Mn—Zn ferrite. Especially, Mn—Mg—Zn ferrite or Ni—Zn ferrite may be preferably used as the ferrite. Examples of the ferromagnetic metal include carbonyl iron, iron-silicon alloy, iron-aluminum-silicon alloy (tradename: Sendust), iron-nickel alloy (trade name: Permalloy), and amorphous metal (such as amorphous iron or amorphous cobalt).

Figure 3B:
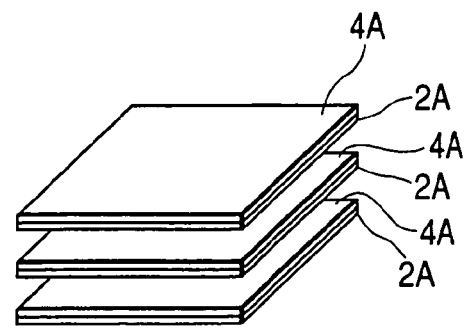
FIG. 3B is a perspective view showing sheets into which the sheet depicted in FIG. 3A is cut by a predetermined length.

The sheet of metal foil 2A with the electrically insulating layer 4A as shown in FIG. 3A is cut into parts each having a size of, for example, 10 cm square as shown in FIG. 3B which is a perspective view.

Figure 3C:
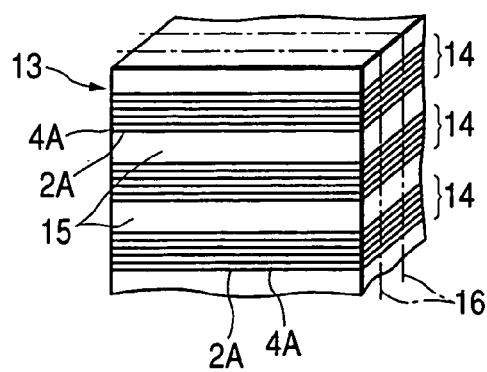
FIG. 3C is a partly perspective view showing a laminated base material formed by integral lamination of the sheets depicted in FIG. 3B.

Then, as shown in FIG. 3C which is a partly perspective view, the square sheets of metal foil 2A with the electrically insulating layer 4A produced in this manner are integrally laminated by means of thermo-compression bonding or, if necessary, through adhesive layers to obtain a laminated base material 13. In this embodiment, the square sheets are integrally laminated while electrically insulating layers 15 each thicker than the electrically insulating layer 4A are interposed between adjacent sets 14 each having a thickness equal to the thickness of one inductance element. Incidentally, the thickness of each of the thick electrically insulating layers 15 is preferably selected to be in a range of from 150 µm to 350 µm.

Figure 3E:
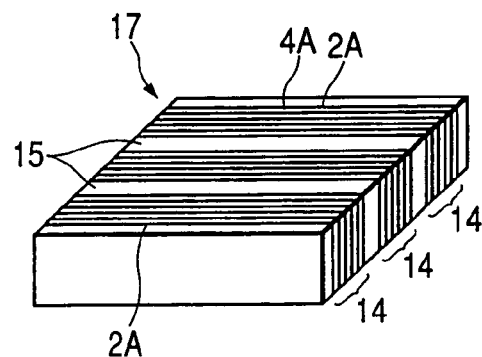
FIG. 3E is a partly enlarged perspective view of the raw material depicted in FIG. 3D.
Figure 3D:
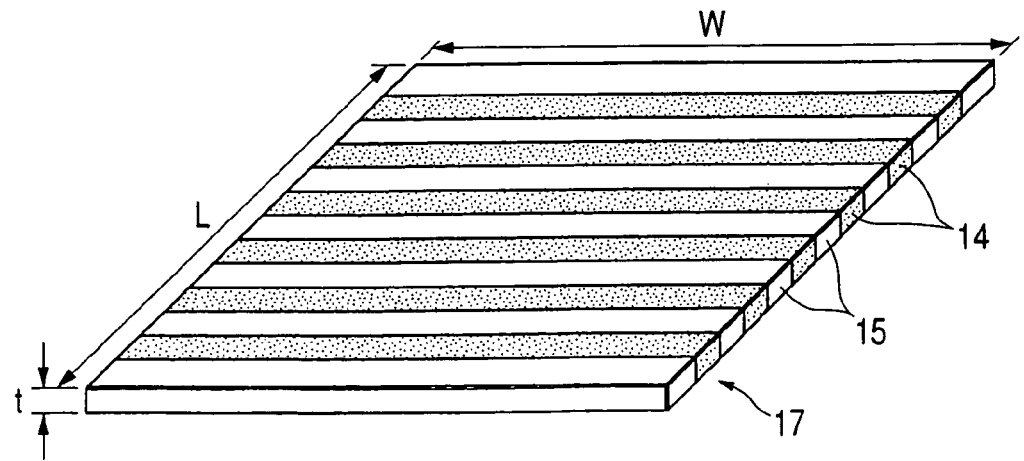
FIG. 3D is an overall perspective view showing a raw material after the laminated base material depicted in FIG. 3C is cut.

Then, as represented by the chain line 16 in FIG. 3C, the laminated base material 13 is cut at regular intervals in the laminating direction to obtain a sheet-like raw material 17 as shown in FIG. 3D which is an overall perspective view. The raw material 17 has a thickness t equal to the thickness of one inductance element and has a size equal to the size (length) of parallel conductor pieces 2a and 2b (the thickness of parallel conductor pieces 2a and 2b in a finished product may be made smaller than the illustrated t if the parallel conductor pieces 2a and 2b are ground after that). Assuming that L is a length taken in the laminating direction of the raw material 17 and W is a width taken in a direction perpendicular to the laminating direction of the raw material 17, then the raw material 17 is formed so that a number of electrical conductor layers corresponding to the number of turns in a plurality of inductance elements (e.g., several ten inductance elements if each inductance element has the aforementioned size) are provided in the length L while a size corresponding to a plurality of inductance elements (e.g., several ten inductance elements if each inductance element has the aforementioned size) is provided in the width W. FIG. 3E is a partly enlarged perspective view of FIG. 3D.

Figure 4A:
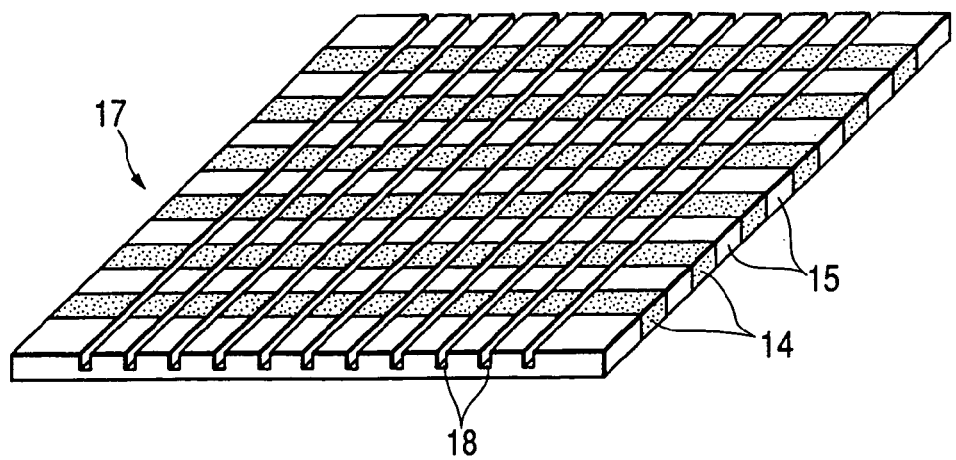
FIG. 4A is an overall perspective view showing a state in which grooves are formed in the raw material used in this embodiment.
Figure 4B:
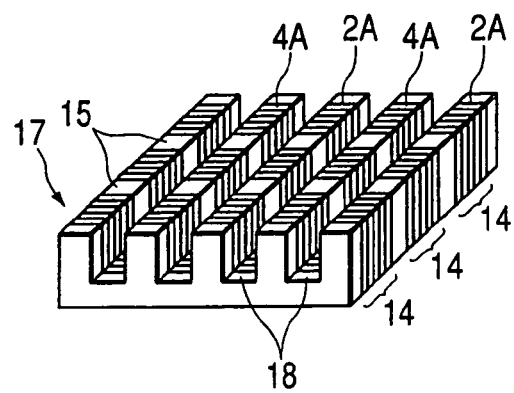
FIG. 4B is a partly enlarged view of the raw material depicted in FIG. 4A.

Then, as shown in FIGS. 4A and 4B which are an overall perspective view and a partly enlarged view respectively, first grooves 18 for forming opposite sides of parallel conductor pieces of the coil 1 are formed at regular intervals in a direction perpendicular to the laminating direction by means of dicing. In this case, as will be described later, the grooves 18 are formed in the condition that the raw material 17 is bonded to a platform 46 through an adhesive sheet 45 as shown in FIGS. 10A to 10D. Incidentally, the width and depth of each groove 18 are preferably selected to be in a range of from 300 µm to 400 µm.

Figure 4C:
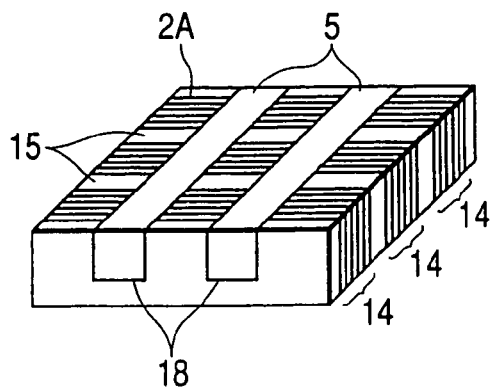
FIG. 4C is a partly enlarged perspective view showing a state in which the grooves are filled with an electrically insulating material.

Then, as shown in FIG. 4C which is a partly enlarged perspective view, the grooves 18 are filled with the electrically insulating material 5. A material prepared in such a manner that the resin material or the composite material as a mixture of a resin and functional material powder is dispersed into a solvent or a binder is used as the electrically insulating material 5. The filling of the grooves 18 with the electrically insulating material 5 is completed by drying the electrically insulating material 5 applied onto a surface in which the grooves 18 are formed. A surface on the side where the grooves 18 are filled with the electrically insulating material 5 in this manner (i.e., a surface to be a bottom surface of a finished product) is ground so that the surface is shaped (smoothened) while portions where the metal foil 2A is covered with the electrically insulating material 5 are removed.

Figure 5A:
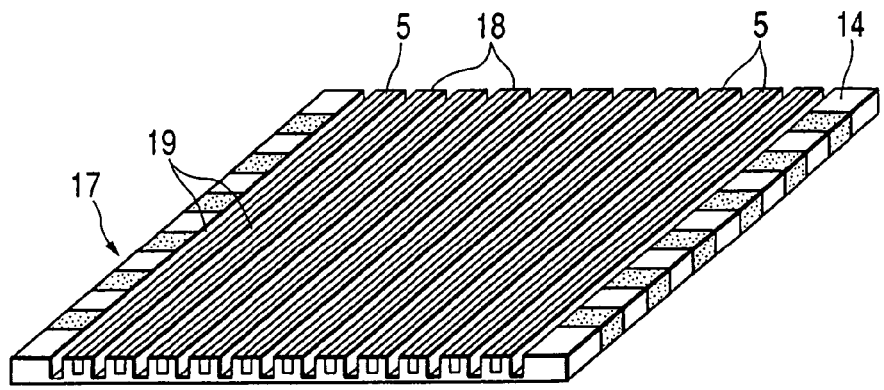
FIG. 5A is an overall perspective view of the raw material used in this embodiment, showing a state in which second grooves are formed between first grooves for forming parallel conductor pieces.

Then, as shown in FIG. 5A which is a perspective view, second grooves 19 for forming side surfaces of elements are formed between the grooves 18 (filled with the electrically insulating material 5) by means of cutting so as to be parallel with the grooves 18.

Figure 5B:
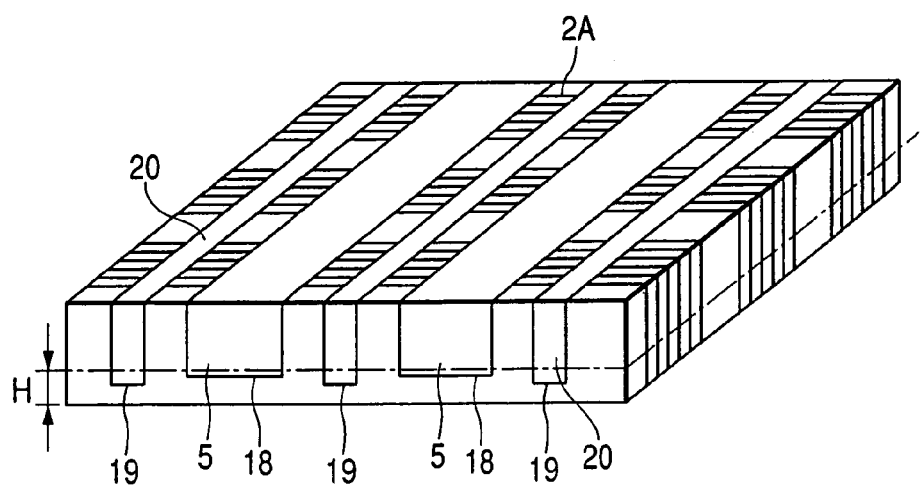
FIG. 5B is a partly enlarged perspective view showing a state in which the second grooves depicted in FIG. 5A are also filled with an electrically insulating material.

Then, as shown in FIG. 5B which is a partly enlarged perspective view, the grooves 19 are filled with an electrically insulating material 20 for forming electrically insulating layers 11 on side surfaces of each element. A surface on the opening side of the grooves 19 is ground so as to be shaped.

Then, a portion of the height H shown in FIG. 5B, that is, a portion corresponding to the bottoms of the grooves 18 and 19 is ground and removed, so that the surface is shaped.

Figure 5C:
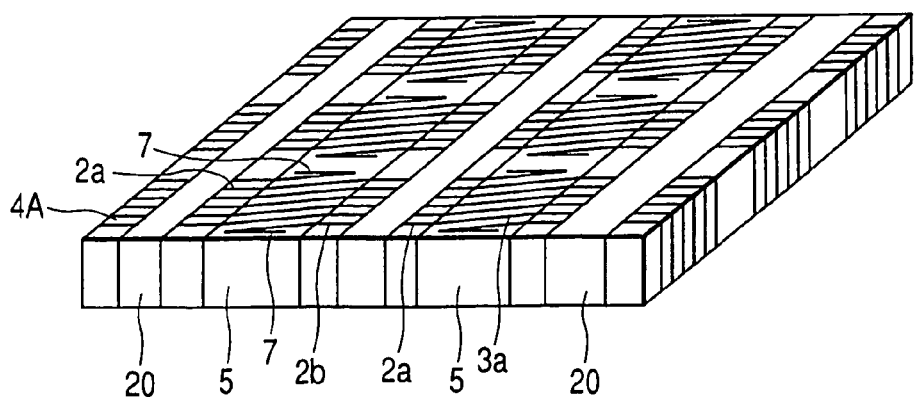
FIG. 5C is a partly enlarged perspective view showing a state in which adjacent parallel conductor pieces are connected to one another by patterned conductor pieces.
Figure 7A:
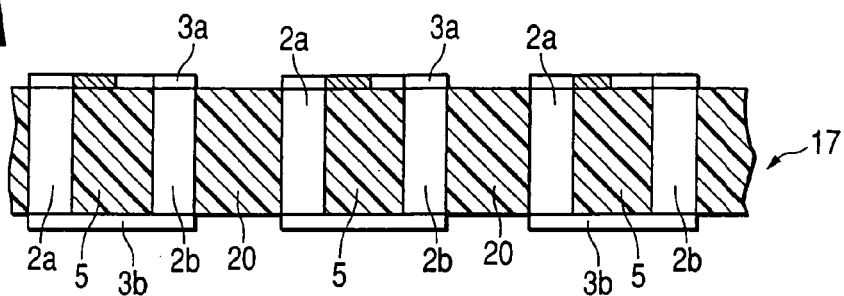
FIG. 7A is a sectional view of the raw material depicted in FIG. 5C.

Then, as shown in FIGS. 5C and 7A, bridging conductor pieces 3a and 3b for connecting adjacent parallel conductor pieces 2a and 2b to one another and electrode pads 7 are formed on the shaped top and bottom surfaces by photolithography.

Figure 6A:
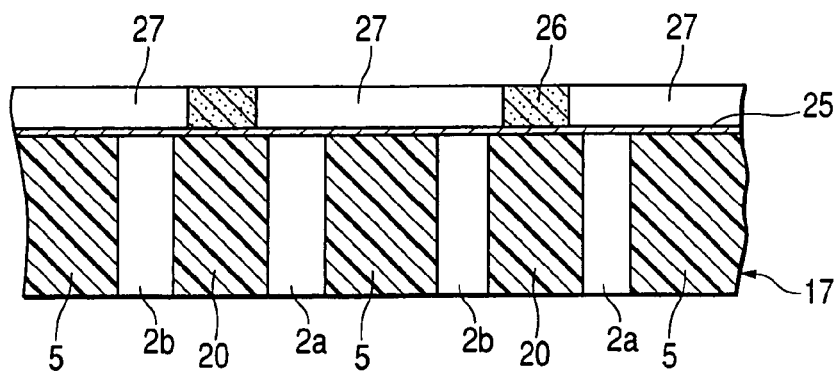
FIG. 6A is a sectional view showing a state in which an undercoat film and resist patterns for forming bridging conductor pieces are formed on the raw material used in this embodiment.
Figure 6B:
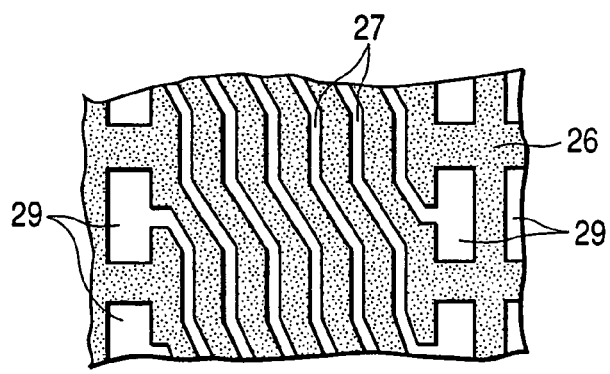
FIG. 6B is a plan view of the raw material depicted in FIG. 6A.
Figure 6C:
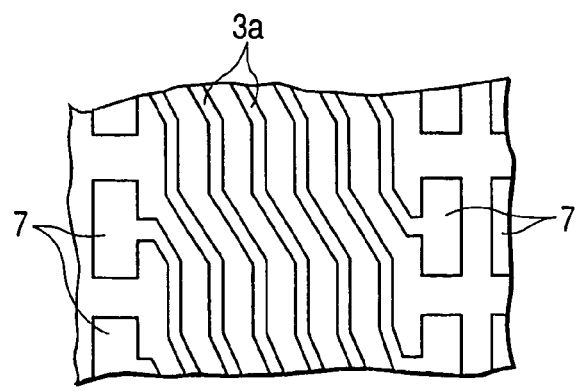
FIG. 6C is a plan view showing patterns of bridging conductor pieces and electrode pads formed by plating and removal of the resist patterns.

This patterning can be made by a semi-additive method as shown in FIGS. 6A, 6B and 6C. That is, a copper film is formed as an undercoat layer 25 on the wgroove of a front surface (as well as a rear surface) of the raw material 17 by electroless plating or sputtering. After a resist 26 is then applied on the wgroove front surface, the resist 26 is partially removed from portions 27 for forming bridging conductor pieces 3a and portions 29 for forming electrode pads 7 by photolithography. A copper layer is formed on the removed resist portions 27 and 29 by electroplating. Then, the residual part of the resist 26 and the undercoat layer 25 under the resist 26 are removed.

Besides electroplating such as a semi-additive method or an additive method, a thin film forming method such as sputtering, vapor deposition or CVD may be preferably used for forming such fine patterns. Alternatively, etching or printing may be used for forming the bridging conductor pieces 3a and 3b, and so on. Copper, silver, gold, platinum, palladium, aluminum or the like can be used as the material of the bridging conductor pieces 3a and 3b.

Figure 7B:
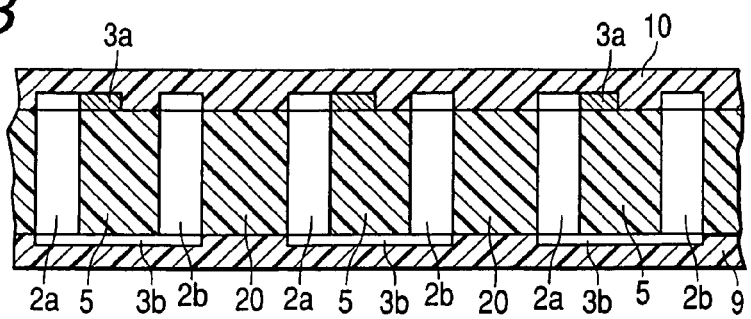
FIG. 7B is a sectional view showing a state in which electrically insulating layers are provided one the grooves and the front and rear surfaces of the raw material depicted in FIG. 7A.

Then, the front and rear surfaces of the raw material 17 shown in FIG. 7A are covered with electrically insulating layers 9 and 10 respectively as shown in FIG. 7B. The electrically insulating layers 9 and 10 can be formed by printing, spin coating or sheet deposition or adhesion.

Figure 7C:
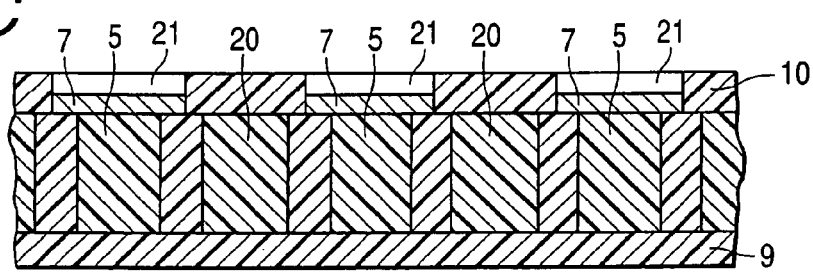
Figure 7D:
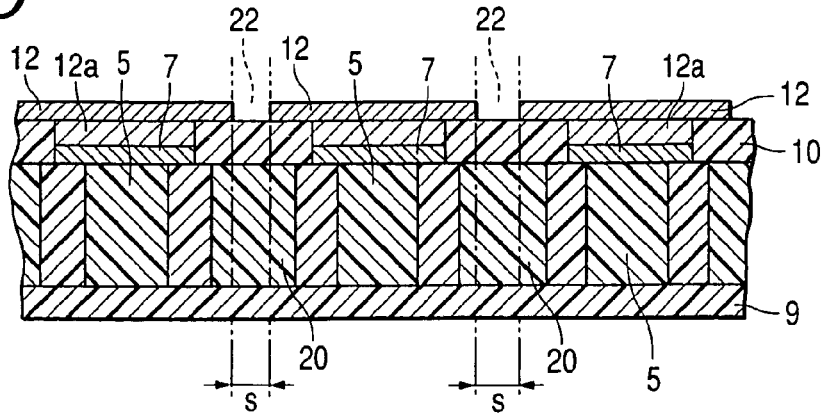
FIG. 7D is a sectional view showing a state in which terminal electrodes are formed in the holes and on a surface of the raw material.

Then, as shown in FIG. 7C, holes 21 are formed in the electrically insulating layer 10 on the portions of the electrode pads 7 by laser beam machining or the like. Then, the holes 21 are filled with copper as an undercoat layer 12a by electroplating or with an electrically conductive agent of a silver-containing resin as an undercoat layer 12a by printing or the like. Then, terminal electrodes 12 to be subjected to soldering are formed, for example, in such a manner that the undercoat layer 12a is plated with nickel and tin successively. Incidentally, the terminal electrodes 12 can be also formed on end surfaces or side surfaces of the element if the undercoat layer 12a is formed after holes are formed in portions corresponding to the end surfaces or side surfaces of the element.

Figure 8:
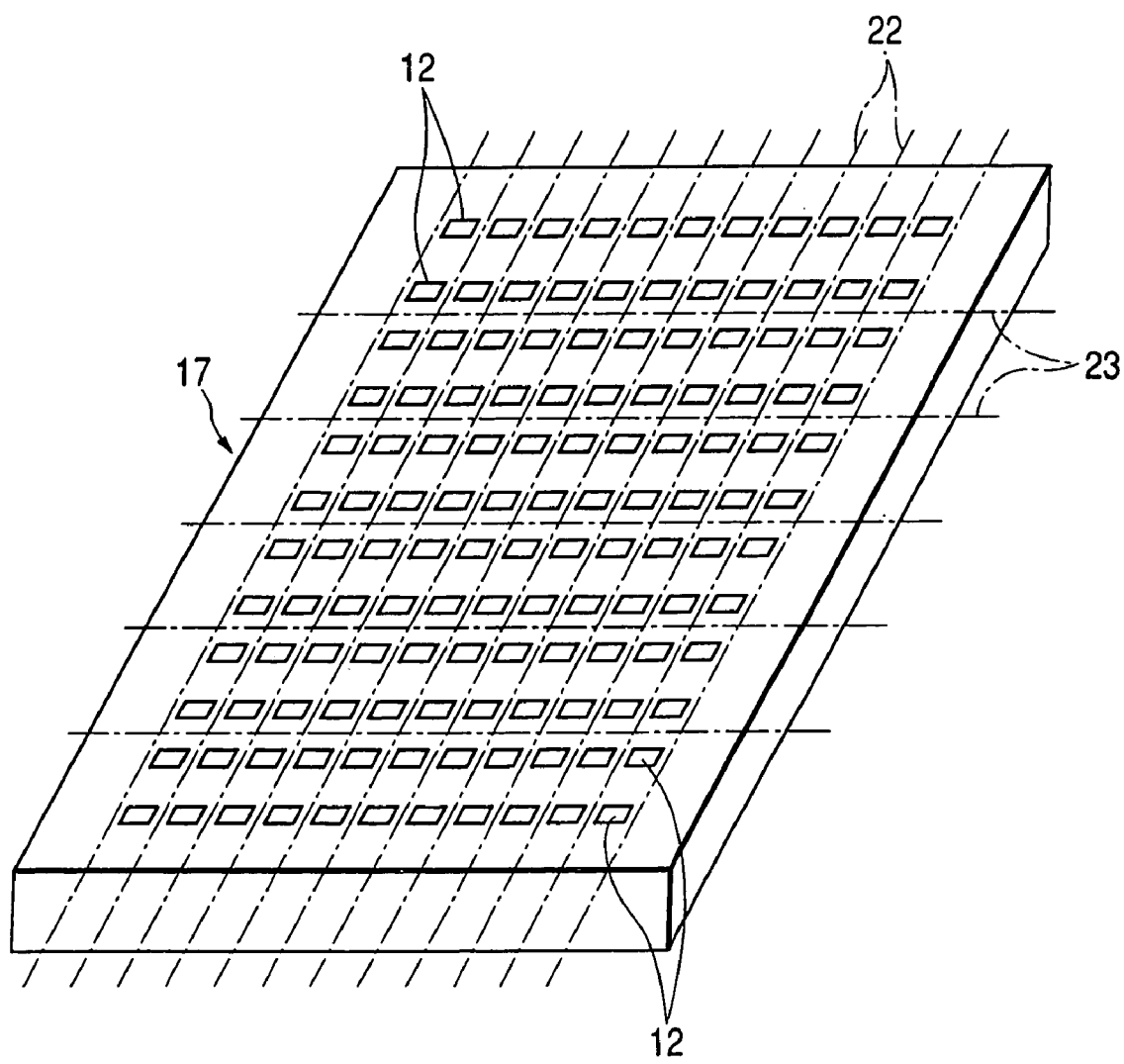
FIG. 8 is an overall perspective view showing the raw material and cutting portions in the case where two terminal electrodes are formed so as to correspond to each of helical coils formed in the raw material.

FIG. 8 is an overall perspective view of a raw material 17 including a plurality of helical coils 1 for each of which two terminal electrodes 12 are formed. As shown in FIG. 8, the raw material 17 is diced along lines 23 in a direction perpendicular to the direction of the grooves 18. After or before the dicing, the raw material 17 is diced along lines 22 shown in FIG. 8 so that the center portion of the electrically insulating material 20 having a width s shown in FIG. 7D and packed in each groove 19 is removed. In this manner, respective chips are obtained while the electrically insulating layers 11 are formed on the respective side surfaces of the chips.

As described above, in the invention, the parallel conductor pieces 2 and outer circumferential portions of the helical coils 1 are formed by cutting. Accordingly, the shapes of the coils become uniform, so that positional displacement in the parallel conductor pieces and variation in lamination can be eliminated to make it possible to obtain inductance elements uniform in inductance value and narrow in tolerance.

Moreover, conductors for forming the helical coils 1 are processed simultaneously by cutting. Accordingly, element scan be produced easily and inexpensively. When the electrically insulating material 5 and the electrically insulating layers 9 to 11 are made of a resin or a composite material containing the resin as described in this embodiment, processing can be made easily.

Although a sintered mixture etc. containing an electrically conductive adhesive agent and ceramics of conductor paste as described above can be used as each of the conductors, metal foil 2A may be used as described in this embodiment. In this embodiment, because specific resistance of the parallel conductor pieces can be suppressed to a low level compared with such a ceramic inductor, DC resistance can be suppressed to a low level so that high Q characteristic can be obtained.

When surfaces on which the bridging conductor pieces 3a and 3b will be formed are ground so as to be shaped, the shapes of the coils can be made more uniform as well as the conductor pieces 3a and 3b which are bridging portions formed by patterning can be connected to end portions of the parallel conductor pieces 2a and 2b sufficiently.

In this embodiment, the grooves 19 are provided in cutting regions between the grooves 18 through which chips are set in array. The grooves 19 are filled with the electrically insulating material 20. The center portion of the electrically insulating material 20 packed in each groove 19 is cut by cutting means. In this manner, chips each having opposite side surfaces covered with the electrically insulating material can be formed simultaneously with the cutting. The labor for additionally applying an electrically insulating material onto side surfaces of each chip can be made unnecessary, so that chips can be produced efficiently.

In this embodiment, a raw material having a thickness equal to the thickness of a plurality of chips may be prepared and cut to obtain a plurality of raw materials 17. In this case, the number of steps for forming a laminate can be reduced.

The invention may be also applied to a raw material having a size larger or smaller than the aforementioned size. The metal foil 2A may be replaced by a metal plate.

A specific example will be described below. An inductance element composed of a coil of 12 turns and having a planar size of 1 mm long and 0.5 mm wide and a thickness of 0.5 mm was produced by way of trial. A composite material having a relative dielectric constant $\in$ of 2.9 and composed of a vinyl benzyl resin and silica powder mixed and dispersed in the vinyl benzyl resin was used as the electrically insulating material 5 and as each material of the electrically insulating layers 4 and 9 to 11. Metal foil of copper was used as the coil conductor pieces 2a and 2b. The thickness of the metal foil was set at 35 µm. The thickness of the electrically insulating layer 4 was set at 25 µm. The width and depth of each groove 18 were set at 360 µm and 330 µm respectively. Thin-film copper was used as the bridging conductor pieces 3. The inductance element exhibited an inductance value of 15 nH and a Q value of about 60 (1 GHz). On the other hand, an inductance element having the same size and composed of a coil of a spiral structure formed from a thin film according to the background art exhibited a Q value of about 20, and an inductance element formed from a ceramic laminate exhibited a Q value of about 30. Accordingly, it was confirmed that great improvement in Q value can be achieved by the invention.

Figure 9A:
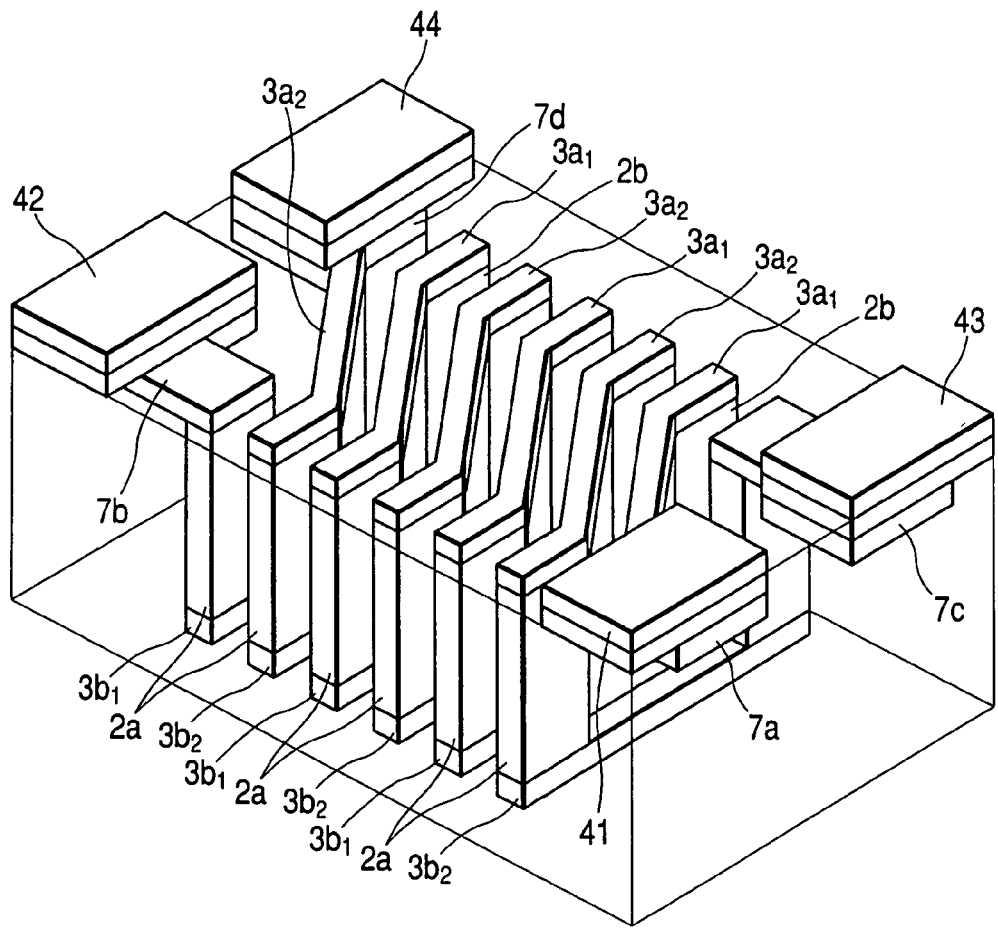
FIG. 9A is a see-through perspective view showing an inductance element according to another embodiment of the invention.

FIG. 9A shows an inductance element according to another embodiment of the invention. The inductance element is formed as a choke coil or a transformer. In this embodiment, parallel conductor pieces 2a and 2b are connected to one another by conductor pieces 3a1 and 3a2 provided alternately and by conductor pieces 3b1 and 3b2 provided alternately, respectively, to thereby form two rectangular helical coils as two series of coils. The reference numerals 7a and 7b designate electrode pads connected to opposite ends of one of the two helical coils; 7c and 7d, electrode pads connected to opposite ends of the other helical coil; and 41 to 44, terminal electrodes formed on the electrode pads 7a to 7d respectively.

When the structure of connection of the parallel conductor pieces 2a and 2b by the bridging conductor pieces is modified in this manner, two helical coils can be formed.

Figure 9B:
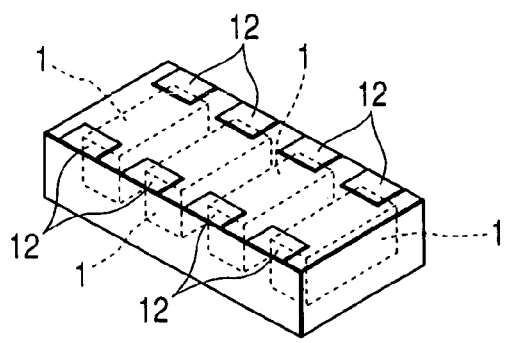
FIG. 9B is a perspective view showing inductance elements according to a further embodiment of the invention.

As shown in FIG. 9B, one chip can be formed as an inductance element array including a plurality of helical coils 1 arranged in parallel with one another. When the number of turns in a helical coil 1 is set according to necessity, a chip can be formed as an inductance element having an antenna function.

In the inductance element according to the invention, when a magnetic substance is used as at least one of the electrically insulating material 5 and the electrically insulating layers (the electrically insulating layer 9 on the top surface, the electrically insulating layer 10 on the bottom surface and the electrically insulating layers on side surfaces) for covering the outer circumference of the coil while a dielectric substance is used as the parallel conductor pieces 2, an inductance element exhibiting a high inductance value can be obtained. Although a composite material containing a resin and magnetic substance powder mixed with the resin can be used as the electrically insulating material 5, a rod-like metal magnetic substance of high magnetic permeability such as Permalloy or Sendust coated with an electrically insulating material may be used as the electrically insulating material 5 so that an inductance element exhibiting a higher inductance value can be obtained. When a magnetic substance which is a mixture of a resin and magnetic powder is used as the electrically insulating layers 9 to 11 for covering the outer circumference of the coil while each groove 18 is filled with the magnetic substance serving as a magnetic core, an inductance element exhibiting a further higher inductance value can be obtained. Incidentally, when the metal magnetic substance is used, the metal magnetic substance may be preferably fixed into each groove 18 by an electrically insulating adhesive agent so as to be electrically insulated from the parallel conductor pieces 2a and 2b.

Figure 10A:
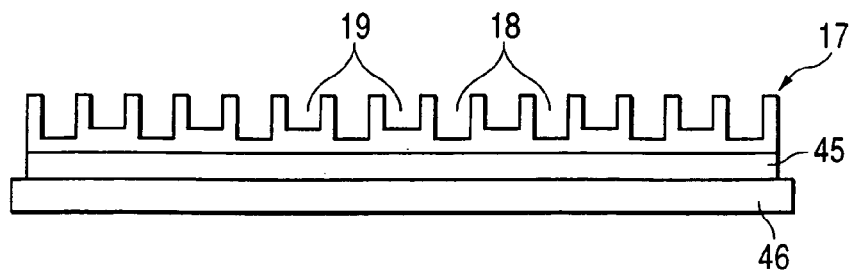
FIG. 10A is a step view showing a method for producing inductance elements according to a further embodiment of the invention.

FIGS. 10A to 10D are step views showing a method of producing inductance elements according to a further embodiment of the invention. As shown in FIG. 10A, in the condition that a raw material 17 prepared as a laminate including a plurality of inductance elements as shown in FIGS. 3D and 3E is bonded to a platform 46 by an adhesive sheet 45, the first grooves 18 are formed by cutting and the second grooves 19 are formed between the first grooves 18 by cutting so as to be parallel with the first grooves 18.

Figure 10B:
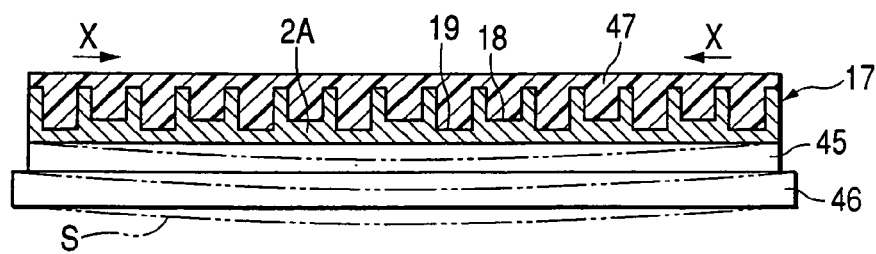
FIG. 10B is a step view showing the method for producing inductance elements according to the embodiment of the invention.
Figure 10C:
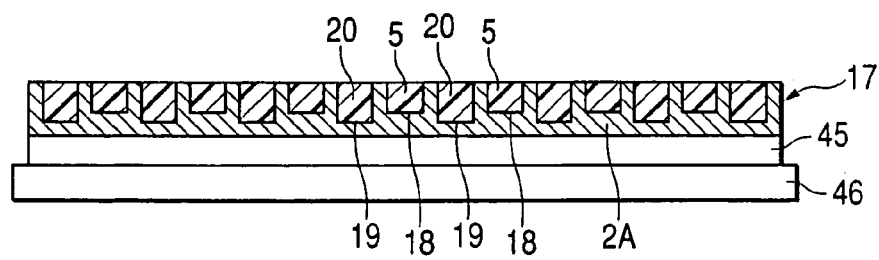
FIG. 10C is a step view showing the method for producing inductance elements according to the embodiment of the invention.

Then, as shown in FIG. 10B, the grooves 18 and 19 are simultaneously filled with an electrically insulating material 47 which is the aforementioned resin material or composite material in a molten state. The electrically insulating material 47 is solidified. Then, as shown in FIG. 10C, the electrically insulating material 47 is ground so that the front surface of the raw material is shaped while the metal foil 2A is revealed partially. Then, as shown in FIG. 5B, the bottoms of the grooves 18 and 19 are removed by grinding. Inductance elements are obtained by the same steps as described above.

Figure 10D:
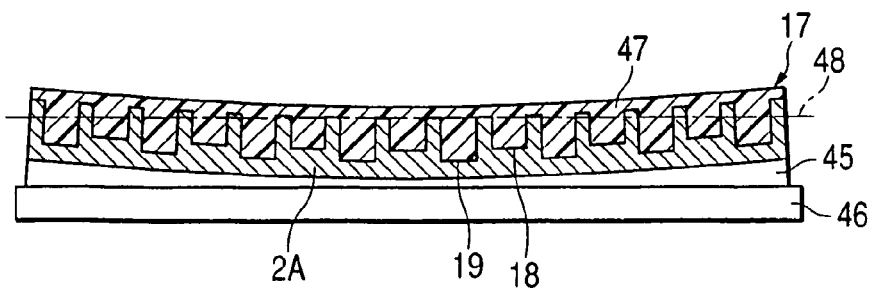
FIG. 10D is a step view showing the method for producing inductance elements according to the embodiment of the invention.

In the aforementioned process of producing inductance elements, the grooves 18 and 19 can be simultaneously filled with the electrically insulating material 47. Accordingly, inductance elements can be produced efficiently. There is however the following disadvantage. When the electrically insulating material 47 as a resin material or a resin-containing composite material is cured, the electrically insulating material 47 shrinks as represented by the arrows X in FIG. 10B. As a result, the raw material 17 is warped as represented by the chain double-dashed line S in FIG. 10B, that is, as shown in FIG. 10D. When the front surface of the raw material 17 is ground planarly as represented by the line 48 in FIG. 10D, the opening portions of the grooves 18 and 19 of the metal foil 2A at the left and right ends in FIG. 10D are ground more deeply than those at the center portion. As a result, the lengths of the parallel conductor pieces 2a and 2b cannot be made uniform.

On the other hand, when packing and grinding of the electrically insulating material 5 in the grooves 18, cutting of the grooves 19 and packing and grinding of the electrically insulating material 20 in the grooves 19 are performed stepwise as shown in FIGS. 4A to 4C and FIGS. 5A to 5C, the problem of a warp of the raw material can be relaxed.

Figure 11A:
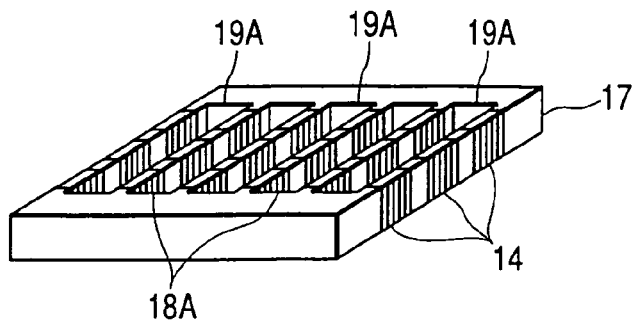
FIG. 11A is a step view showing a method for producing inductance elements according to a further embodiment of the invention.
Figure 11B:
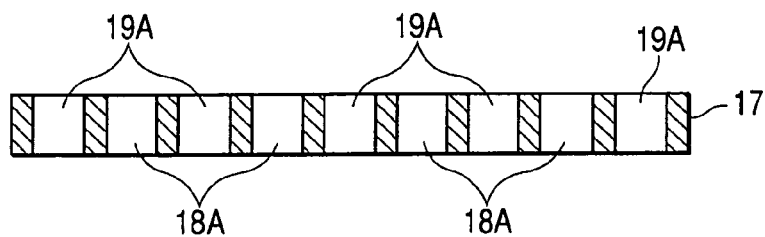
FIG. 11B is a step view showing the method for producing inductance elements according to the embodiment of the invention.
Figure 11C:
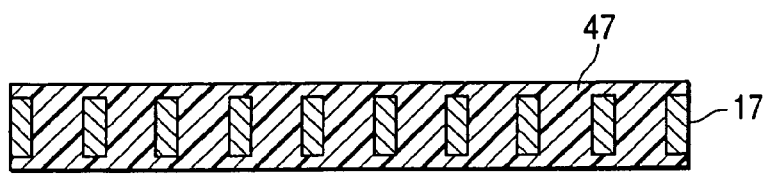
FIG. 11C is a step view showing the method for producing inductance elements according to the embodiment of the invention.
Figure 11D:
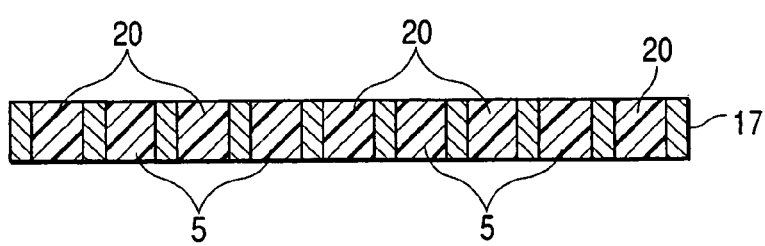
FIG. 11D is a step view showing the method for producing inductance elements according to the embodiment of the invention.
Figure 11E:
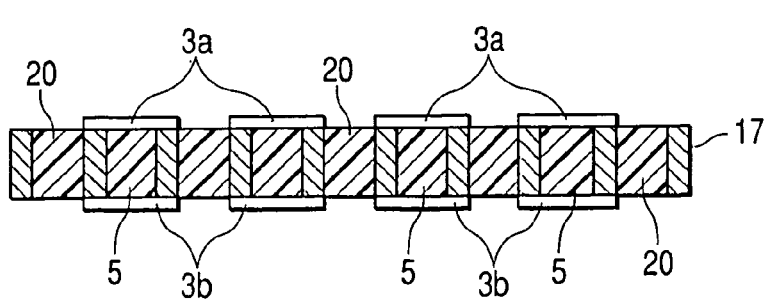
FIG. 11E is a step view showing the method for producing inductance elements according to the embodiment of the invention.

FIGS. 11A to 11E are step views showing a method of producing inductance elements according to a further embodiment of the invention. As shown in FIGS. 11A and 11B, the raw material 17 is cut so that first and second slots (through-grooves) 18A and 19A corresponding to the first and second slots 18 and 19 respectively are formed in the raw material 17. As shown in FIG. 11C, the slots (through-grooves) 18A and 19A are filled with the molten-state electrically insulating material 47. The electrically insulating material 47 is solidified. Then, as shown in FIG. 11D, front and rear surfaces of the raw material 17 filled with the electrically insulating material 47 are ground so as to be shaped, so that metal foil portions in the front and rear surfaces of the raw material 17 are revealed. Then, as shown in FIG. 11E, bridging conductor pieces 3a and 3b are formed on the front and rear surfaces of the raw material 17.

According to the method shown in FIGS. 11A to 11E, the problem of a warp of the raw material 17 caused by the filling of the grooves 18 and 19 with the electrically insulating material 47 from one surface as shown in FIGS. 10A to 10D can be solved. Moreover, the step of removing the bottoms of the grooves 18 and 19 by grinding can be omitted, so that inductance elements can be produced efficiently. When the slots 18A and 19A are formed, there is however a problem that the raw material 17 is weakened in terms of fragility between the slots 18A and 19A compared with the method in which the grooves 18 and 19 are provided. Accordingly, the method shown in FIGS. 11A to 11E is preferably used in the case where the thickness between adjacent slots 18A and 19A can be easily kept relatively large.

Figure 12A:
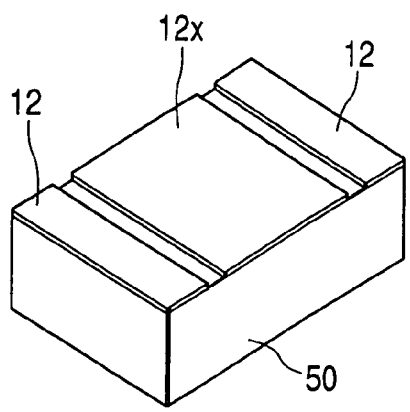
FIG. 12A is a perspective view showing a laminated electronic component according to an embodiment of the invention.
Figure 12B:
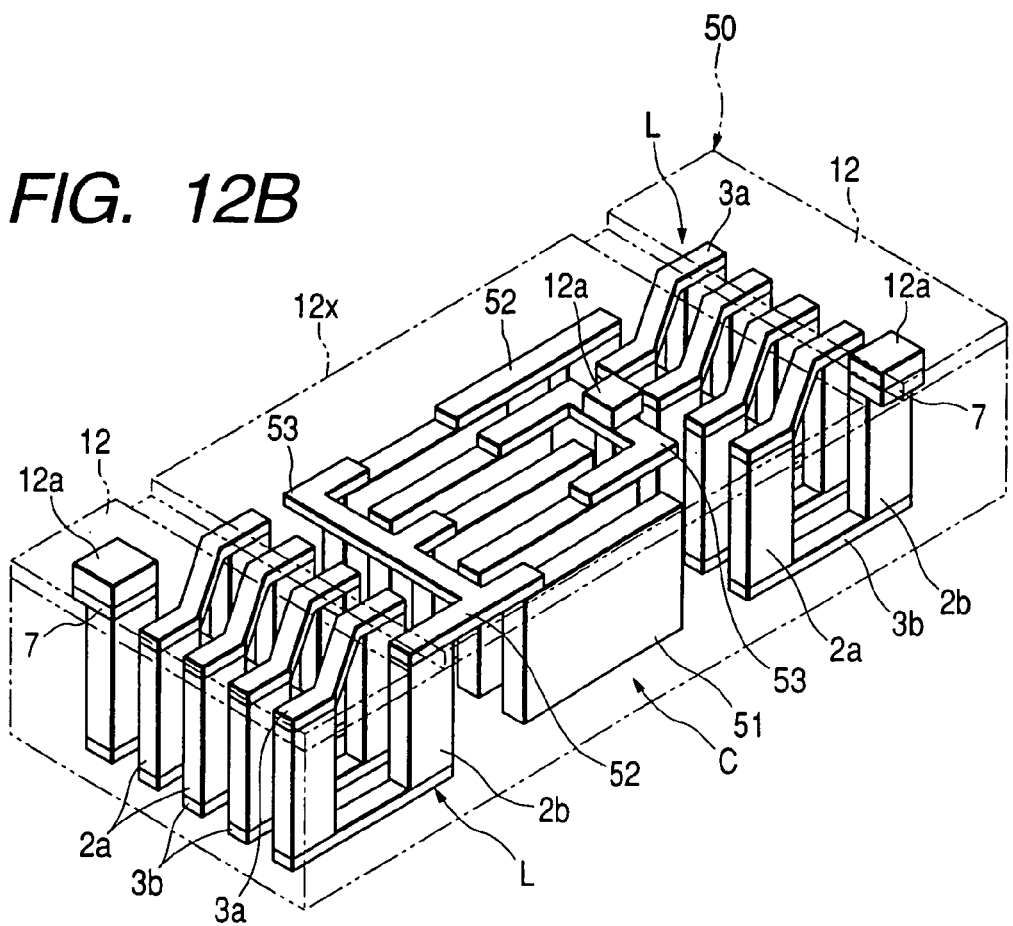
FIG. 12B is a see-through perspective view showing the internal structure of the laminated electronic component.
Figure 12C:
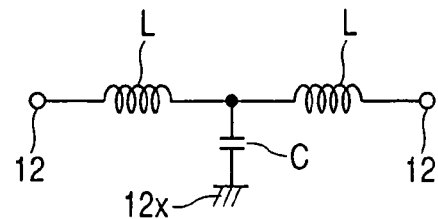
FIG. 12C is a diagram of a circuit equivalent to the laminated electronic component.
Figure 13A:
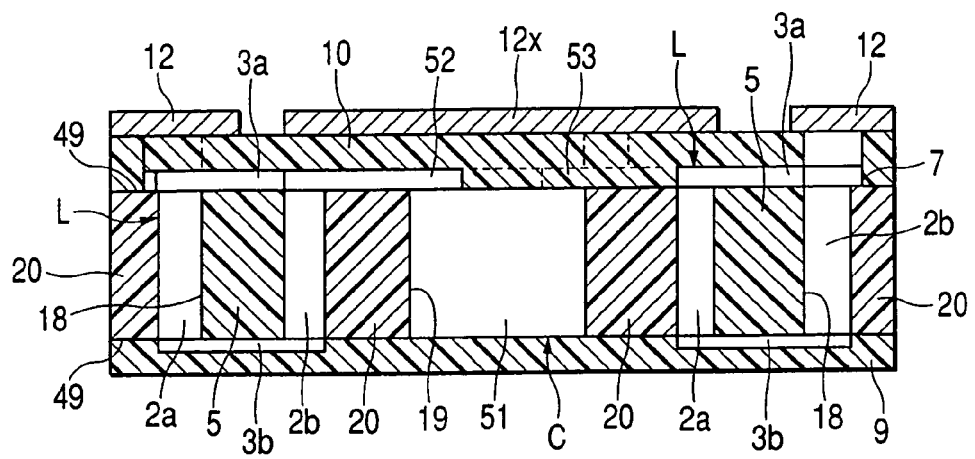
FIG. 13A is a vertical sectional view of the laminated electronic component according to this embodiment.
Figure 13B:
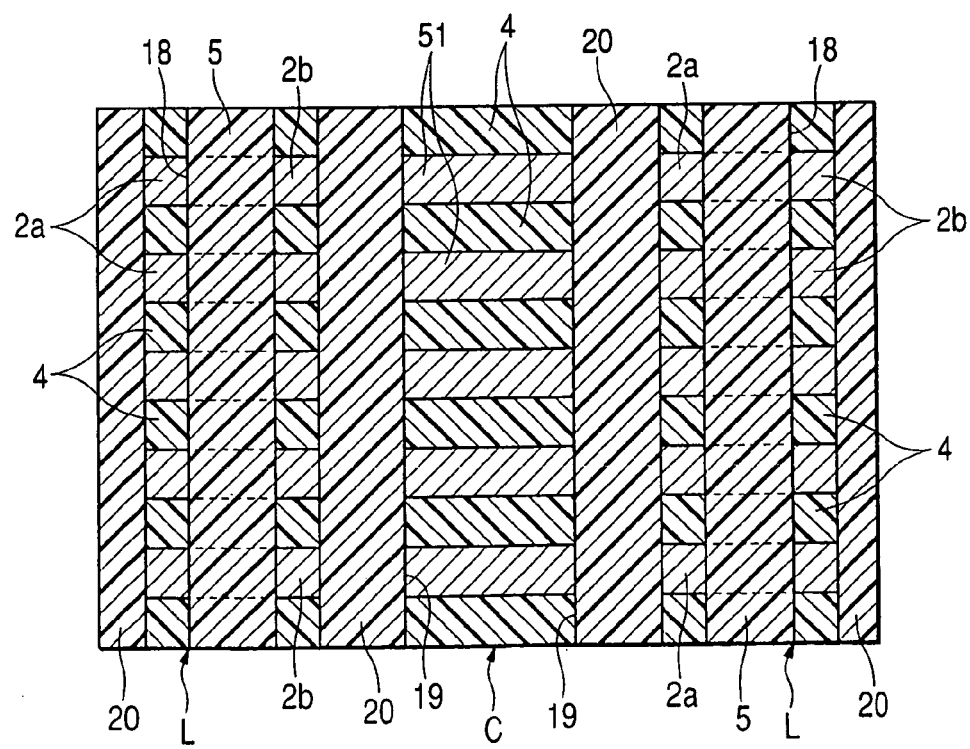
FIG. 13B is a horizontal sectional view of the laminated electronic component.

FIG. 12A is a perspective view showing an LC filter as an example of the laminated electronic component according to the invention in the case where the LC filter is turned upside down. FIG. 12B is a see-through perspective view of the LC filter. FIG. 12C is a diagram of a circuit equivalent to the LC filter. FIG. 13A is a vertical sectional view of the LC filter. FIG. 13B is a horizontal sectional view of the LC filter.

The LC filter includes at least one inductance element L (two elements in this example), and at least one capacitance element C (one element in this example). These elements L and C are provided in a substrate made of a resin material or a composite material as a mixture of a resin and functional material powder (magnetic substance powder or dielectric substance powder) of ceramics or the like. In this example, two inductance elements L and one capacitance element C form a T-type filter shown in FIG. 12C. Terminal electrodes 12 and a ground electrode 12X for soldering to a printed board are provided on the bottom surface of the laminated electronic component.

As shown in FIG. 12B, each of the inductance elements L is formed as a rectangular helical coil which has pairs of parallel conductor pieces 2a and 2b, and pairs of bridging conductor pieces 3a and 3b. Each pair of parallel conductor pieces 2a and 2b form two of four sides of one turn of the coil. Each pair of bridging conductor pieces 3a and 3b form the other two sides. End portions of the parallel conductor pieces 2a and 2b are connected to one anther by the bridging conductor pieces 3a and 3b to thereby form the rectangular helical coil as a wgroove.

The capacitance element C has capacitor electrodes 51, and a pair of connecting conductors 52 and 53 for connecting the capacitor electrodes 51 alternately. The capacitor electrodes 51 are made of the same laminated raw material as that of the parallel conductor pieces 2a and 2b by a process which will be described later. The capacitance element C is connected to the inductance elements L by inter-element connecting conductors 52. The elements L and C are connected to the terminal electrodes 12 and the ground electrode 12X by electrode pads 7. At the same time that the bridging conductor pieces 3a and 3b and the connecting conductors 52 and 53 are connected, the electrode pads 7 are connected. The elements L and C are connected to the terminal electrodes 12 and the ground electrode 12X by conductors 12a as undercoat layers of the electrodes 12 and 12X.

As shown in the sectional view of FIG. 13B, electrically insulating layers 4 are interposed between the parallel conductor pieces 2a and 2a, between the parallel conductor pieces 2b and 2b and between the capacitor electrodes 51 and 51. Opposite surfaces of the parallel conductor pieces 2a and 2b and opposite surfaces of the capacitor electrodes 51 are formed on the same planes with respect to the laminating direction by cutting as will be described later. That is, opposite surfaces of the parallel conductor pieces 2a and 2b are formed as side surfaces of the grooves 18 and 19 by the aforementioned cutting process. The grooves 18 and 19 are filled with electrically insulating materials 5 and 20.

Surfaces 49 (see FIG. 13A) which are of the electrically insulating material 5 between the parallel conductor pieces 2a and 2b and of the inter-element electrically insulating material 20 and on which opposite ends of the parallel conductor pieces 2a and 2b are located are ground so as to be shaped. The bridging conductor pieces 3a and 3b, the connecting conductors 52 and 53 and the electrode pads 7 are formed on the shaped surfaces. The reference numerals 9 and 10 designate electrically insulating layers which are provided by means of printing or spin coating or by means of sheet deposition or adhesion so that the top and bottom surfaces of the laminated electronic component are covered with the electrically insulating layers 9 and 10 respectively. The terminal electrodes 12 and the ground electrode 12X are provided on the electrically insulating layer 10 provided on the bottom surface of the laminated electronic component.

Figure 14A:
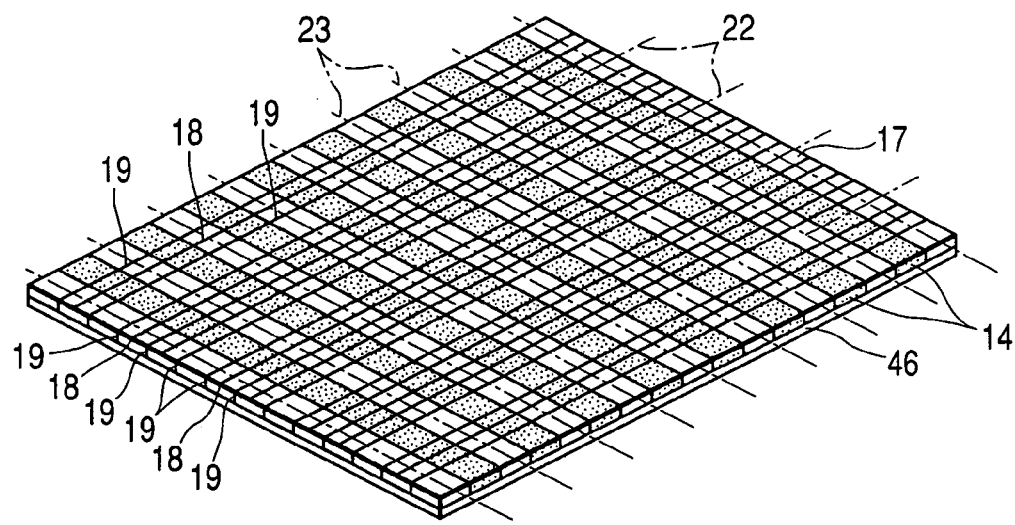
FIG. 14A is an overall perspective view showing a state in which grooves are formed in a raw material used in this embodiment.
Figure 14B:
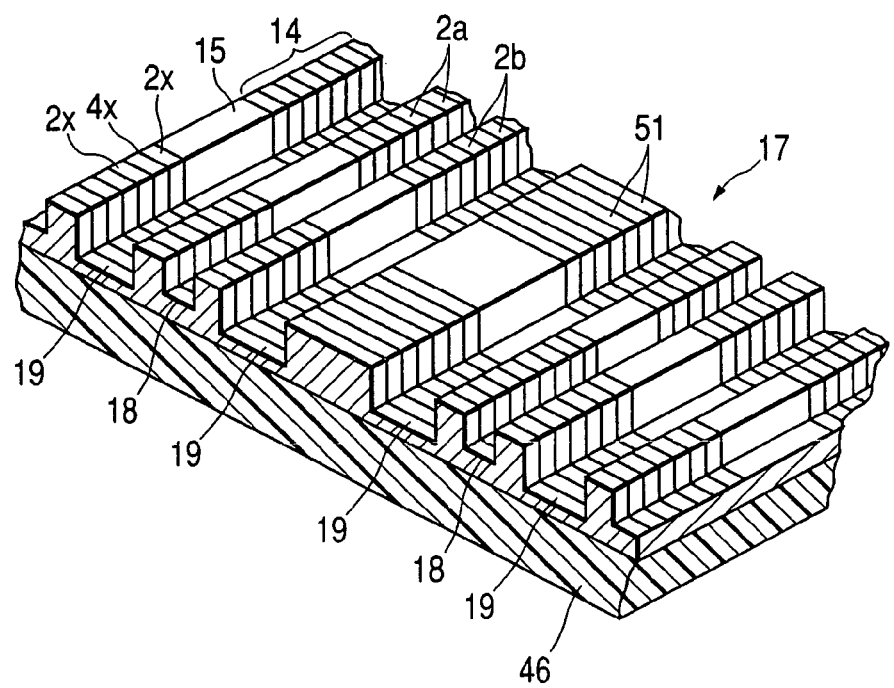
FIG. 14B is a partly enlarged view of the raw material.
Figure 15:
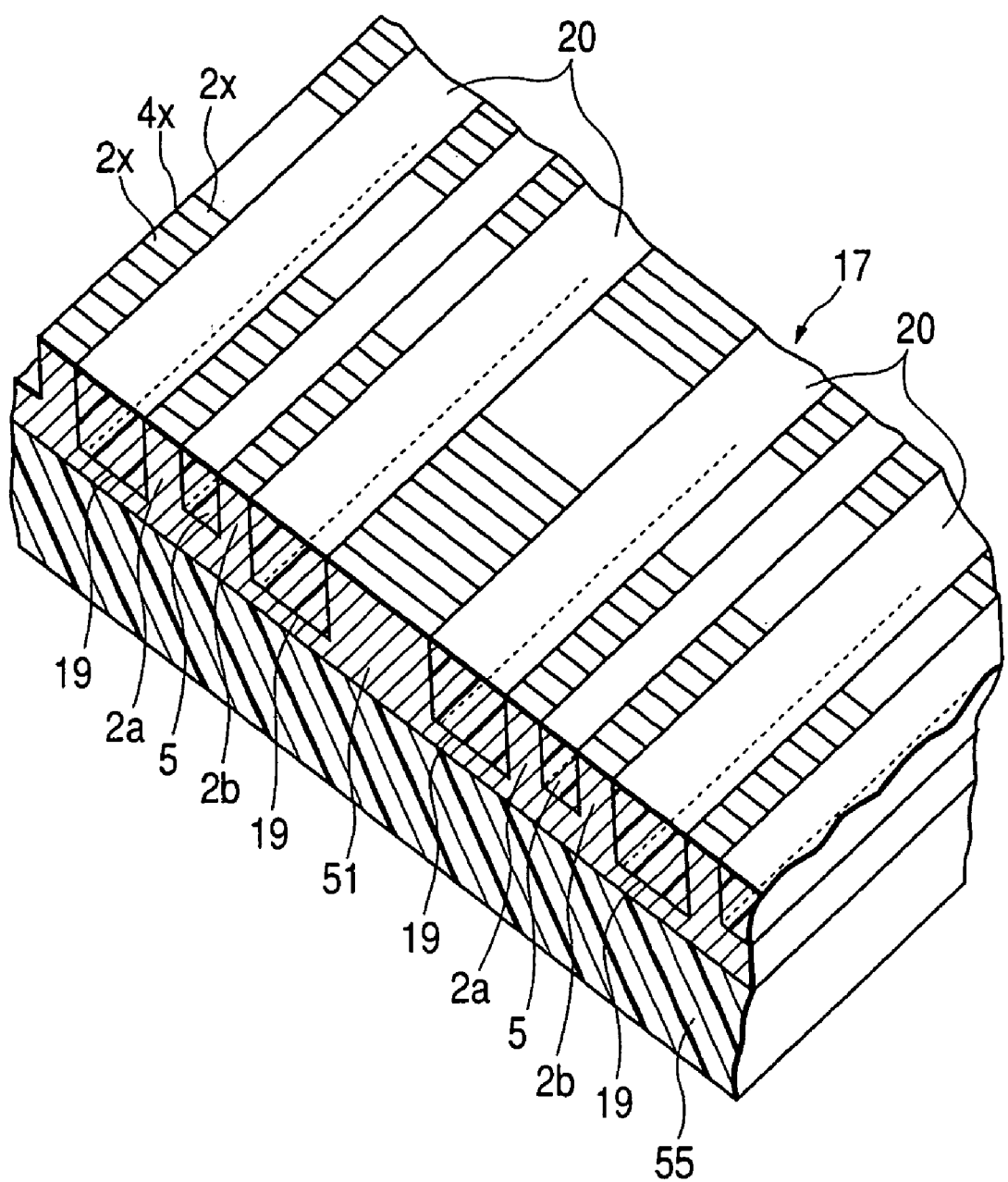
FIG. 15 is a partly enlarged perspective view of the raw material used in this embodiment, showing a state in which the grooves are filled with an electrically insulating material.

FIGS. 14A and 14B and FIG. 15 show an example of a method for producing such LC filters. As shown in FIGS. 14A and 14B, the raw material 17 shown in FIGS. 3D and 3E are cut so that the grooves 18 for forming the parallel conductor pieces 2a and 2b and the grooves 19 for separating elements (or forming side surfaces of electrodes) are formed in parallel with one another. Then, as shown in FIG. 15, the grooves 18 and 19 are filled with electrically insulating materials 5 and 20 which are made of the aforementioned resin material or composite material. The front surface of the raw material 17 is ground so as to be shaped. Then, the same process as shown in FIGS. 5A to 5C, FIGS. 6A to 6C and FIGS. 7A to 7D is carried out. That is, the bottoms of the grooves 18 and 19 are removed by grinding. The bridging conductor pieces 3a and 3b, the pads 7 and the connecting conductors 52 and 53 are formed. The undercoat electrodes 12a, the terminal electrodes 12 and the ground electrode 12X are formed. Then, the raw material 17 is cut along the lines 22 and 23 shown in FIG. 14A so as to be separated into respective chips.

A method shown in the description of the inductance element may be used as the method for producing such LC filters. That is, there may be used a method including the steps of: providing grooves 18; filling the grooves 18 with an electrically insulating material 5; grinding a surface of the electrically insulating material 5; providing grooves 19; filling the grooves 19 with an electrically insulating material 20; and grinding a surface of the electrically insulating material 20. Alternatively, a method of providing slots as shown in FIGS. 11A to 11E may be used as the method for producing such LC filters.

In the laminated electronic component according to the invention, the parallel conductor pieces 2a and 2b of each coil and the capacitor electrodes 51 are formed by cutting of a laminate. Accordingly, the shapes of the coils and the shapes of the electrodes can be made uniform. Positional displacement and laminating variation in the parallel conductor pieces 2a and 2b and the capacitor electrodes 51 can be avoided. Laminated electronic components uniform both in inductance value and in capacitance value and narrow in tolerance can be provided. Moreover, because conductors for forming the parallel conductor pieces 2a and 2b of each helical coil and the capacitor electrodes 51 are processed simultaneously by cutting, the laminated electronic component can be produced easily and inexpensively.

Moreover, when the electrically insulating layers 4 are made of a resin material or a resin-containing composite material, processing can be made easily. When the kinds of the materials used in the composite material are changed, a laminated electronic component exhibiting any specific characteristic can be obtained.

When a metal plate or a sheet of metal foil is used as the material of the parallel conductor pieces 2a and 2b and the capacitor electrodes 51 while a conductor formed by photolithography is used as the material of the bridging conductor pieces, specific resistance of each coil can be suppressed to a low level. Accordingly, DC resistance can be reduced, so that a higher Q characteristic can be obtained.

Specific examples of the laminated electronic component produced according to the invention include an antenna, a band-pass filter, a low-pass filter, a high-pass filter, an EMC filter, a common mode filter, a delay line, a trap, a balloon transformer, a coupler (directional coupler), a diplexer, a duplexer, a double-balanced mixer, a power synthesizer, and a power distributor.

Figure 16A:
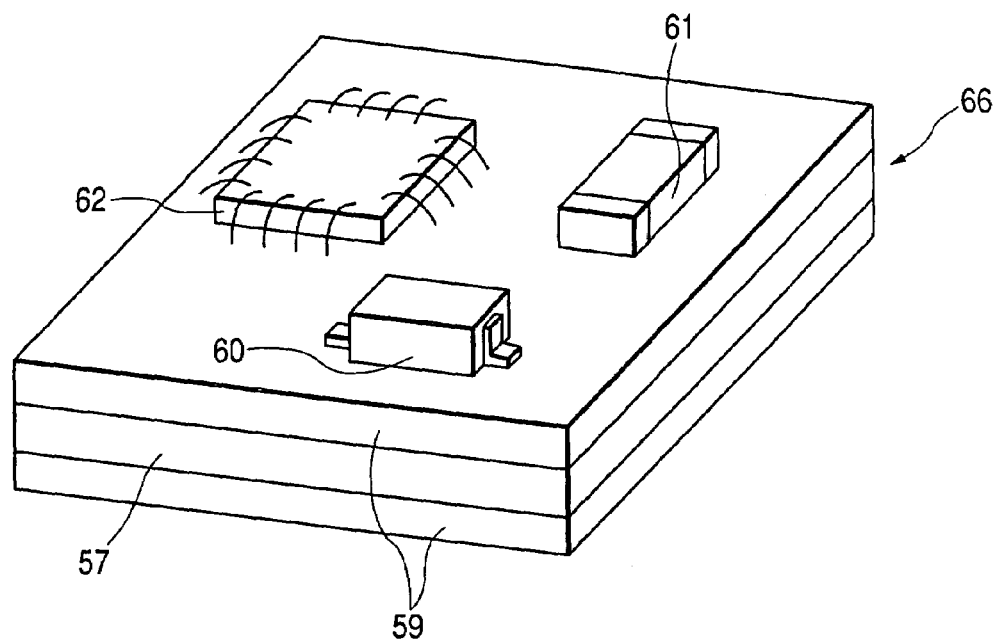
FIG. 16A is a perspective view showing a laminated electronic component module according to an embodiment of the invention.

FIG. 16A is a perspective view showing a laminated electronic component module according to an embodiment of the invention. As shown in FIG. 16A, the module according to this embodiment is configured so that electronic parts such as a semiconductor device 60, a large-capacitance capacitor 61, a bare chip 62, etc. are mounted on a laminated board (module) 66 composed of a core board 57 and upper and lower buildup layers 59. The shapes of the parts and the mounting forms of the parts can be changed variously from those shown in FIG. 16A.

Figure 17A:
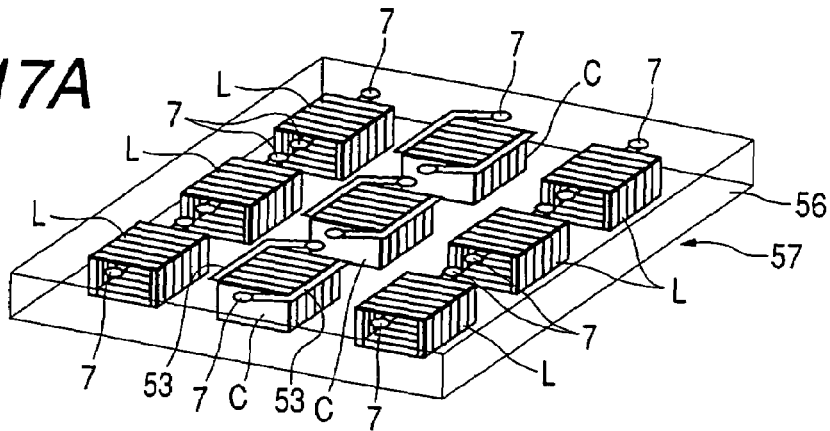
FIG. 17A is a see-through perspective view showing a core board incorporated in the module according to this embodiment.
Figure 17B:
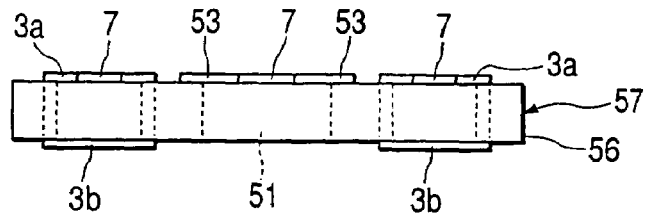
FIG. 17B is a front view of the core board.
Figure 17C:
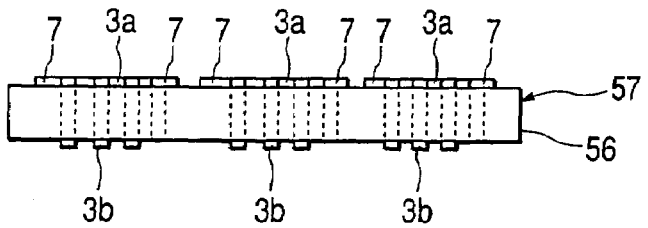
FIG. 17C is a side view of the core board.
Figure 17D:
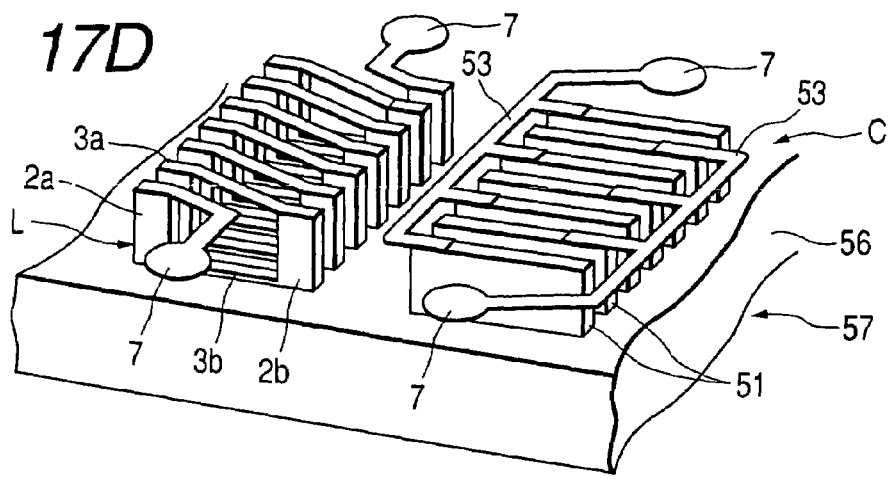
FIG. 17D is a partly enlarged see-through perspective view of the core board.

FIG. 17A is a see-through perspective view showing an example of the core board 57. FIG. 17B is a front view of the core board 57. FIG. 17C is a side view of the core board 57. FIG. 17D is a partly enlarged see-through perspective view of the core board 57. The core board 57 shown in this example includes two rows of a number of inductance elements L (three elements in the illustrated example) arranged in a core direction, and one row of the same number of capacitance elements C (three elements in the illustrated example). Each inductance elements L has parallel conductor pieces 2a and 2b, and bridging conductor pieces 3a and 3b. These conductor pieces 2a, 2b, 3a and 3b are formed in the aforementioned resin material or resin-containing composite material by the aforementioned production method. Each capacitance element C has capacitor electrodes 51 formed by the aforementioned production method. Each of the inductance elements L and capacitance elements C has pads 7 for connecting the element to another layer element, wiring or the like. The bridging conductor pieces 3a and 3b and the electrode connecting conductors 53 are exposed at surfaces of the core board 57. However, the electrically insulating layers 9 and 10 are not provided on the upper and bottom surfaces of the core board 57. Incidentally, the core board 57 maybe formed so that the elements L and C are connected to one another by inter-element connecting conductors 52 as shown in the aforementioned embodiment.

Figure 16B:
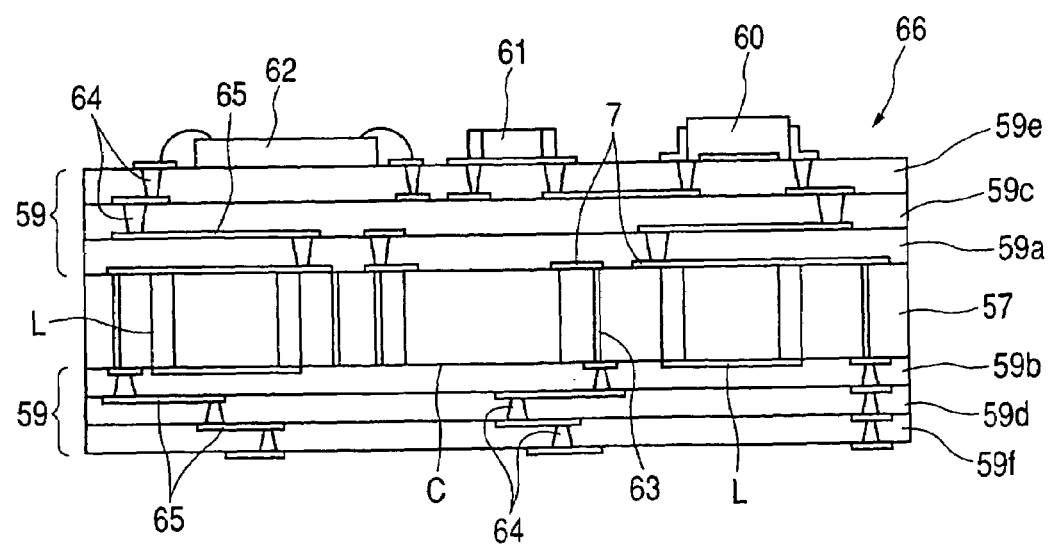
FIG. 16B is a view showing the layer structure of the laminated electronic component module.

FIG. 16B shows the internal structure of this module. Laminated electronic components inclusive of the inductance and capacitance elements L and C produced by the aforementioned production method are contained in the core board 57. The inductance and capacitance elements L and C are structurally laminated in a direction perpendicular to the laminating direction of the module 57. These elements L and C are connected to other elements in the module 66 or the core board 57 or to the bare chip 62 by the pads 7 and via-holes 63 made of surface conductors of the core board 57 and via-holes 64 and wiring patterns 65 of the buildup layers 59. The buildup layers 59 are formed on the upper and lower surfaces of the core board 57 used as a core so that layers 59a and 59b, layers 59c and 59d and layers 59e and 59f are laminated respectively and successively.

The wiring patterns 65 are formed in the respective layers 59a to 59f while the buildup layers are formed. The wiring patterns 65 of the layers 59a to 59f are connected to one another by the via-holes 64 which are formed so as to pierce the layers respectively. Though not shown in this embodiment, an inductance element, a capacitance element or a passive element such as a resistance element may be formed in each buildup layer 59.

The buildup layers 59 can be formed by a buildup method generally applied to a printed board. That is, the build up layers 59 can be formed by repeating the steps of: laminating sheets of prepreg and conductor foil; curing the prepreg; forming conductor patterns by etching; and connecting layers to one another. Besides the buildup method, the module may be formed by lamination of the core board 57 including the inductance and capacitance elements L and C, another core board and prepreg. Connection of conductors between the core board 57 and another buildup layer 59 or connection between other buildup layers 59 may be made by through-holes or inner via-holes. A plurality of core boards 57 may be provided in one module 66.

When at least one inductance element L having parallel conductor pieces formed on the basis of the formation of grooves in the laminate, and bridging conductor pieces and, if necessary, at least one capacitance element C are contained in the module 66, a laminated electronic component module 66 with built-in inductance and capacitance elements L and C of high accuracy and low tolerance can be obtained. Moreover, because the core board 57 containing the inductance and capacitance elements L and C is contained as one board in a resin board or a resin-containing composite material board, the production process can be simplified greatly compared with the case where chip parts are embedded. Accordingly, reduction in cost can be achieved. Moreover, because inductance and capacitance elements L and C of high accuracy can be contained, trimming is not required so that reduction in cost can be attained.

Moreover, when the core direction of the inductance element L is set at a direction perpendicular to the laminating direction of the module, the degree of cross flux when magnetic flux generated in the inductance element L crosses upper and lower ground electrodes (not shown), capacitor electrodes (not shown) and the wiring layers can be reduced so that the magnetic flux is little affected by these electrodes and layers. Accordingly, a module with a built-in inductance element L of high inductance and high Q characteristic can be obtained.

If the core direction of the inductance element L is made coincident with the laminating direction of the board of the module, the number of turns in a coil and the number of capacitor electrodes 51 are apt to be limited. However, when the core direction is set at the surface direction of the board, an inductance element L with a large number of turns and a capacitance element C with a large number of capacitor electrodes 51 can be contained in the board so that a high inductance value and a high capacitance value can be secured.

For the aforementioned reason, the self-resonant frequency of the inductance element L is so high that the coefficient of coupling to another inductance element can be reduced as well as a high inductance value and a high capacitance value can be secured. Accordingly, the characteristic of the module can be improved. In addition, because a structure in which small electrodes are laminated as a plurality of layers can be applied to the capacitance element C, a capacitance element C of low inductance and low resistance can be formed. For this reason, the characteristic of the module can be also improved greatly.

Specific examples of the module according to the invention include an antenna switch module, a front end module, a power amplifier module, a VCO/PLL module, a TCXO module, an IF module, an RF module, a power amplifier isolator module, and an antenna front end module in mobile communication apparatus or the like. The invention may be further applied to an optical pickup, a DC-DC converter, a tuner unit, etc.

In the inductance element and the method of producing the inductance element according to the invention, a raw material is cut to form parallel conductor pieces for forming two sides of a helical coil, and the other two sides are formed of conductor pieces formed by patterning. Accordingly, the inductance element can be mass-produced easily and displacement in conductor patterns can be reduced to obtain an inductance value of narrow tolerance. When a metal plate or a sheet of metal foil is used as the material of the conductor pieces, an inductance element exhibiting high Q characteristic can be obtained.

According to the invention, a helical coil for forming an inductance element and capacitor electrodes of a capacitance element are formed by the formation and cutting of grooves. Accordingly, there can be obtained a laminated electronic component or a laminated electronic component module which can be mass-produced easily and which displacement in conductor patterns can be reduced to obtain inductance and capacitance values of narrow tolerance.

According to the invention, parallel conductor pieces of an inductance element and capacitor electrodes of a capacitance element are formed not by printing but by formation of grooves in a laminate. Accordingly, the production process can be simplified so that reduction in cost can be achieved.

In the laminated electronic component module according to the invention, when laminated electronic components are embedded in the module, the core direction of the inductance element is set at a direction perpendicular to the laminating direction of the module. Accordingly, the degree of cross flux when magnetic flux generated in the inductance element crosses the upper and lower ground electrodes, the capacitor electrodes and the wiring layers can be reduced so that the magnetic flux is little affected by the upper and lower ground electrodes, the capacitor electrodes and the wiring layers. As a result, high inductance and high Q characteristic can be obtained.

What is claimed is:

1. An inductance element produced from a laminate having electrical insulators and electrical conductors laminated alternately, said inductance element comprising a helical coil having a plurality of turns each constituted by four sides, wherein:
    two of said four sides of each turn of the coil are formed as two parallel conductor pieces when said laminate is processed so that a plurality of slots are formed in said laminate or a plurality of grooves are formed in said laminate and bottoms of said grooves are removed;
    said grooves formed in the laminating direction by said processing are filled with an electrically insulating material;
    the other two sides of each turn of the coil are formed as two bridging conductor pieces which are formed on said electrically insulating material packed in said grooves so that end portions of said two parallel conductor pieces formed by said processing are connected to each other by said two bridging conductor pieces to thereby form said helical coil; and
    top, bottom and side surfaces of said element are covered with electrically insulating layers respectively while external connecting terminal electrodes are provided on portions where part of said electrically insulating layers are removed.

2. An inductance element according to claim 1, wherein said inductance element is formed as an array of inductance elements.

3. An inductance element according to claim 1, wherein said inductance element has an antenna function.

4. An inductance element according to claim 1, wherein said inductance element forms a transformer.

5. An inductance element according to claim 1, wherein said electrical insulators, said electrically insulating material and said electrically insulating layers are made of either of a resin material and a composite material as a mixture of a resin and functional material powder.

6. An inductance element according to claim 1, wherein said parallel conductor pieces are made of either of a metal plate and a sheet of metal foil whereas said bridging conductor pieces are formed by photolithography.

* * * * *